United States Patent
McCallister

(10) Patent No.: US 7,099,399 B2
(45) Date of Patent: Aug. 29, 2006

(54) DISTORTION-MANAGED DIGITAL RF COMMUNICATIONS TRANSMITTER AND METHOD THEREFOR

(75) Inventor: Ronald Duane McCallister, Scottsdale, AZ (US)

(73) Assignee: Crestcom, Inc., Scottsdale, AZ (US)

( * ) Notice: Subject to any disclaimer, the term of this patent is extended or adjusted under 35 U.S.C. 154(b) by 33 days.

(21) Appl. No.: 10/766,801

(22) Filed: Jan. 27, 2004

(65) Prior Publication Data

US 2005/0163250 A1 Jul. 28, 2005

(51) Int. Cl.
*H03C 5/00* (2006.01)
(52) U.S. Cl. .................. 375/269; 375/285; 375/296
(58) Field of Classification Search .............. 375/229, 375/230, 231, 232, 235, 296, 278, 297, 260, 375/284, 285, 295
See application file for complete search history.

(56) References Cited

U.S. PATENT DOCUMENTS

| | | | |
|---|---|---|---|
| 4,053,837 A | 10/1977 | Ryan et al. | |
| 4,085,378 A | 4/1978 | Ryan et al. | |
| 4,270,179 A | 5/1981 | Sifford et al. | |
| 4,290,139 A | 9/1981 | Walsh | |
| 4,422,175 A | 12/1983 | Bingham et al. | |
| 4,633,482 A | 12/1986 | Sari | |
| 4,878,029 A | 10/1989 | Saulnier et al. | |
| 4,888,557 A | 12/1989 | Puckette, IV et al. | |
| 4,902,979 A | 2/1990 | Puckette, IV | |
| 4,910,698 A | 3/1990 | McCartney | |
| 5,049,832 A | 9/1991 | Cavers | |
| 5,105,445 A | 4/1992 | Karam et al. | |
| 5,113,414 A | 5/1992 | Karam et al. | |
| 5,226,060 A * | 7/1993 | Goodson et al. | 375/232 |
| 5,243,624 A | 9/1993 | Paik et al. | |
| 5,454,007 A | 9/1995 | Dutta | |
| 5,559,807 A | 9/1996 | van den Heuvel et al. | |
| 5,721,756 A | 2/1998 | Liebetreu et al. | |
| 5,732,333 A | 3/1998 | Cox et al. | |
| 5,745,597 A * | 4/1998 | Agazzi et al. | 382/182 |
| 5,760,646 A | 6/1998 | Belcher et al. | |
| 5,778,029 A | 7/1998 | Kaufmann | |
| 5,790,527 A | 8/1998 | Janky et al. | |
| 5,819,165 A | 10/1998 | Hulkko et al. | |
| 5,867,065 A | 2/1999 | Leyendecker | |
| 5,923,712 A | 7/1999 | Leyendecker et al. | |
| 5,949,832 A | 9/1999 | Liebetreu et al. | |

(Continued)

OTHER PUBLICATIONS

Glentis, Koukoulas, & Kalouptsidis "Efficient Algorithms for Volterra System Identification" IEEE Transactions on Signal Processing, vol. 47, No. 11, Nov. 1999.

(Continued)

*Primary Examiner*—Emmanuel Bayard
(74) *Attorney, Agent, or Firm*—Meschkow & Gresham, PLC

(57) ABSTRACT

A digital communications transmitter (100) includes a digital linear-and-nonlinear predistortion section (200) to compensate for linear and nonlinear distortion introduced by transmitter-analog components (120). A direct-digital-downconversion section (300) generates a complex digital return-data stream (254) from the analog components (120) without introducing quadrature imbalance. A relatively low resolution exhibited by the return-data stream (254) is effectively increased through arithmetic processing. Linear distortion is first compensated using adaptive techniques with an equalizer (246) positioned in the forward-data stream (112). Nonlinear distortion is then compensated using adaptive techniques with a plurality of equalizers (226) that filter a plurality of orthogonal, higher-ordered-basis functions (214) generated from the forward-data stream (112). The filtered-basis functions are combined together and subtracted from the forward-data stream (112).

50 Claims, 12 Drawing Sheets

U.S. PATENT DOCUMENTS

| | | | |
|---|---|---|---|
| 6,112,059 A | 8/2000 | Schwent et al. | |
| 6,118,335 A | 9/2000 | Nielsen et al. | |
| 6,125,266 A | 9/2000 | Matero et al. | |
| 6,141,390 A | 10/2000 | Cova | |
| 6,166,601 A | 12/2000 | Shalom et al. | |
| 6,222,878 B1 | 4/2001 | McCallister et al. | |
| 6,236,837 B1 | 5/2001 | Midya | |
| 6,240,278 B1 | 5/2001 | Midya et al. | |
| 6,281,936 B1* | 8/2001 | Twitchell et al. | 348/470 |
| 6,282,247 B1 | 8/2001 | Shen | |
| 6,298,097 B1 | 10/2001 | Shalom | |
| 6,335,767 B1* | 1/2002 | Twitchell et al. | 348/608 |
| 6,442,217 B1 | 8/2002 | Cochran | |
| 6,507,731 B1 | 1/2003 | Hasegawa | |
| 6,512,800 B1 | 1/2003 | Amir et al. | |
| 6,515,712 B1* | 2/2003 | Jeong | 348/608 |
| 6,600,516 B1* | 7/2003 | Danielsons et al. | 348/608 |
| 6,775,330 B1* | 8/2004 | Bach et al. | 375/296 |
| 6,794,939 B1 | 9/2004 | Kim et al. | |
| 6,819,720 B1 | 11/2004 | Willetts | |
| 2001/0005402 A1 | 6/2001 | Nagatani et al. | |
| 2002/0064236 A1 | 5/2002 | Matsuoka et al. | |
| 2002/0180523 A1 | 12/2002 | Okubo et al. | |
| 2002/0193078 A1 | 12/2002 | Shearer, III et al. | |
| 2003/0020538 A1 | 1/2003 | Kim | |
| 2003/0063682 A1 | 4/2003 | Shearer, III | |
| 2003/0063683 A1 | 4/2003 | Shearer, III et al. | |
| 2003/0076894 A1 | 4/2003 | Jin et al. | |
| 2003/0078074 A1* | 4/2003 | Sesay et al. | 455/561 |
| 2003/0123568 A1 | 7/2003 | Ophir et al. | |
| 2003/0146787 A1 | 8/2003 | Hedberg et al. | |
| 2003/0156658 A1 | 8/2003 | Dartois | |
| 2003/0179831 A1 | 9/2003 | Gupta et al. | |
| 2003/0223508 A1 | 12/2003 | Ding et al. | |
| 2003/0227981 A1 | 12/2003 | Vella-Coleiro et al. | |
| 2004/0013206 A1 | 1/2004 | Gamm et al. | |
| 2004/0021517 A1 | 2/2004 | Irvine et al. | |
| 2004/0164791 A1 | 8/2004 | Bartuni | |
| 2004/0208242 A1 | 10/2004 | Batruni | |
| 2005/0101269 A1 | 5/2005 | Dale et al. | |
| 2005/0123066 A1* | 6/2005 | Sarca | 375/296 |
| 2005/0152476 A1 | 7/2005 | Coersmeier | |

OTHER PUBLICATIONS

Ding, Raich, & Zhou "A Hammerstein Predistortion Linearization Design Based on the Indirect Learning Architecture" Georgia Inst. of Tech. School of Elect. & Comp. Engineering.

Razzaghi & Chang "A 10-b, 1GSample/s ADC using SiGe BiCMOS Technology" Electrical Engineering Department, UCLA.

Daneshrad "DSP VLSI Engine for Electronic Linearization of Fiber Optic Links" Wireless Integrated Systems Research Group, UCLA, Feb. 27, 2001.

Fox "Analysis and Dynamic Range Enhancement of the Analog-to-Digital Interface in Multimode Radio Receivers" Virginia Polytechnic Inst. & State Univ. Feb. 1997.

Hummels "Linearization of ADCS and DACS for All-Digital Wide-Bandwidth Receivers" Depart. of Electrical & Comp. Engineering, Univ. of Maine, Sep. 9, 1999.

Cavers, "The Effect of Quadrature Modulator and Demodulator Errors on Adaptive Digital Predistorters for Amplifier Linearization" IEEE Trans on Veh Tech, vol.46, #2, May 1997.

Ding & Zhou, "Effects of Even-order Nonlinear Terms on Power Amplifier Modeling and Predistortion Linearization" IEEE Transactions on Vehicular Technology, Aug. 2002.

Grass, Bodhisatya & Maharatna, "A Dual-Mode Synchornous/Asynchronous CORDIC Processor" IHP, IM Technologiepark, 2002.

Ohlsson, "Studies on Implementation of Digital Filters With High Throughput and Low Power Consumption" Institute of Technology, Dept of Electrical Engineering, p. 61-73, Jun. 2003.

Raich, Qian & Zhou, "Digital Baseband Predistortion of Nonlinear Power Amplifiers Using Orthogonal Polynomials" Proc. ICASSP 2003) p. 689-692, Hong Kong China Apr. 2003.

Godavarti "Multiple Antennas in Wireless Communications" Array Signal Processing and Channel Capacity University of Michigan, p. 16-52, 2001.

"Pact Application Note: Adaptive Filter Based on the LMS-Algorithm".

Choo "Mapping LMS Adaptive Filter IP Core to Multiplier-Array FPGA Architecture for High Channel-Density VOIP Line Echo Cancellation" CMP United Business Media, 2003.

Widrow, McCool & Ball, "The Complex LMS Algorithm" Information Systems Laboratory, Naval Undersea Center, Fleet Engineering Dept, Aug. 19, 1974.

Park, Woo, Raich, Kenney, Zhou, "Adaptive Predistortion Linearization of RF Power Amplifiers Using Lookup Tables Generated from Subsampled Data", IEEE 2002.

Morgan, MA, "Reducing Measurement Noice Effects in Digital Predistortion of RF Power Amplifiers", Bell Laboratories, IEEE 2003.

Santamaria, Ibanez, Lazaro, Pantaleon, Vielva, "Modeling Nonlinear Power Amplifiers in OFDM Systems from Subsampled Data: A Comparative Study Using Real Measurements" 2003.

Ibanez-Diaz, Pantaleon, Santamaria, Fernandez, Martinez, "Nonlinear Estimation in Power Amplifiers Based on Subsampled Temporal Data", IEEE 2001.

Allen, Brown, "Proceedings of the International Symposium on Advanced Radio Technologies", Mar. 4-7, 2003, US Dept. of Commerce.

Eun, Powers, "A New Volterra Predistortion Based on the Indirect Learning Architecture", 1997 IEEE.

Edmund Coersmeier, Ernst Zielinski, Frequency Selective IQ Phase and IQ Amplitude Imbalance Adjustments for OFDM Direct Conversion Transmitters, Mar. 2003.

* cited by examiner

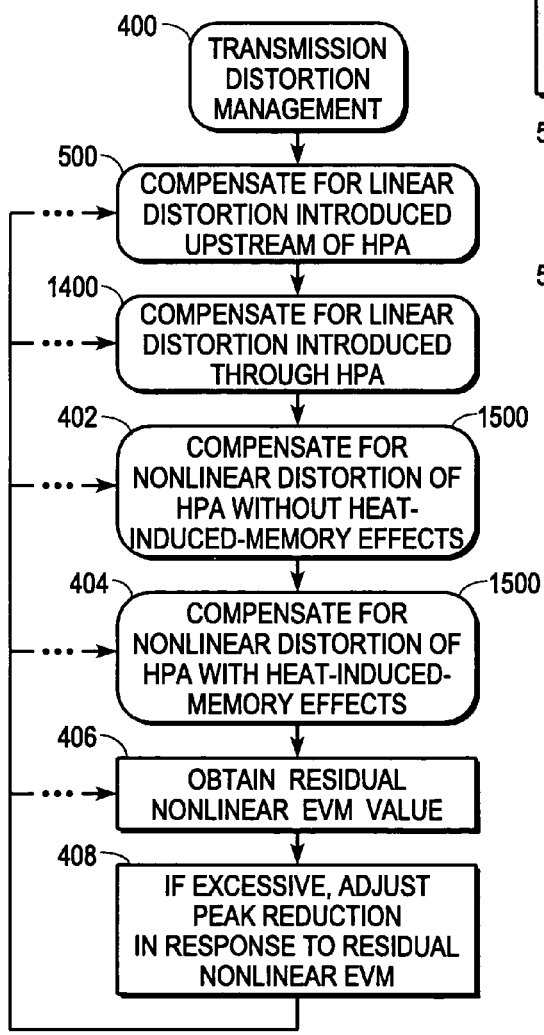
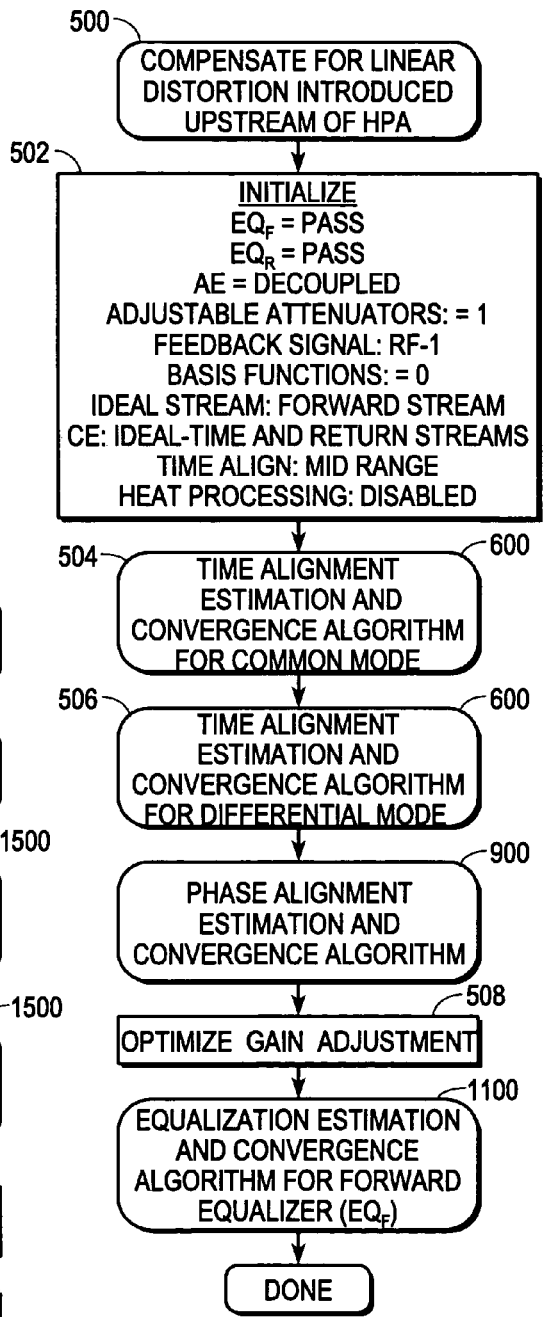

DISTORTION-MANAGED DIGITAL RF COMMUNICATIONS TRANSMITTER AND METHOD THEREFOR

RELATED INVENTIONS

This patent is related to "Predistortion Circuit and Method for Compensating Linear Distortion in a Digital RF Communications Transmitter" and to "Predistortion Circuit and Method for Compensating Nonlinear Distortion in a Digital RF Communications Transmitter", each invented by the inventor of this patent, and each having the same filing date as this patent.

TECHNICAL FIELD OF THE INVENTION

The present invention relates generally to the field of digital RF communications. More specifically, the present invention relates to the control and reduction of inaccuracies introduced into a digital communication signal by analog components of a transmitter.

BACKGROUND OF THE INVENTION

Vast amounts of digital processing can be applied to a communication signal in a digital communications transmitter at low cost. Even a relatively wideband communications signal may be described digitally and processed digitally at great accuracy for a reasonable cost. The digital description of the signal comes from providing a stream of samples at a rate suitable for the bandwidth and at a desired resolution. But the digitally-described-communications signal is nevertheless conventionally converted into an analog form, upconverted, filtered, and amplified for transmission by analog components.

Unlike digital components, analog components achieve only limited accuracy. Moreover, even poor levels of analog accuracy tend to be relatively expensive, and greater accuracy is achieved only at even greater expense. Consequently, a recent trend in digital communications transmitters is to replace analog processing by extending the digital processing as far as possible toward an antenna from which an RF communications signal will be broadcast.

Two other recent trends are the use of modulation forms that require linear amplification and the use of less expensive, but also less accurate, analog components. The modulation forms that require linear amplification are desirable because they allow more information to be conveyed during a given period, over a given bandwidth, and using a given transmission power level. Using less expensive components is always a desirable goal, but it is also an important goal in applications that have mass-market appeal and/or highly competitive markets.

A linear power amplifier is an analog component that is one of the most expensive and also most power-consuming devices in the transmitter. To the extent that a linear power amplifier fails to reproduce and amplify its input signal in a precisely linear manner, signal distortion results. And, as a general rule the distortion worsens as less-expensive and lower-power amplifiers are used.

One type of power-amplifier distortion that has received considerable attention is nonlinearity. Nonlinearity is a particularly prominent characteristic of linear power amplifiers and refers to the extent to which any inaccuracy in an amplifier's output signal fails to be linearly related to the amplifier's input signal. Nonlinearity is particularly troublesome in an RF transmitter because it causes spectral regrowth. While an amplifier's RF-input signal may be well-confined in a predetermined portion of the electromagnetic spectrum, any amplifier nonlinearity causes intermodulation so that the amplifier's RF-output signal covers a larger portion of the electromagnetic spectrum.

Transmitters desirably utilize as much of the spectrum as permitted by regulations in order to efficiently convey information. Consequently, spectral regrowth would typically cause a transmitter to be in violation of regulations. To avoid violating regulations, linear power-amplifiers desirably amplify the communications signal they process in as precisely a linear manner as possible. Another trend faced in digital-communications-transmitter designs is that standards and regulations are continually tightening the spectral-regulatory masks within which transmitters must operate. So the need to minimize the spectral-regrowth consequences of power amplifier nonlinearity is greater than ever.

One way to address the spectral-regrowth consequences of power amplifier nonlinearity is to use a higher-power amplifier and operate that higher-power amplifier at a greater backoff. Backoff refers to the degree to which an amplifier is producing a weaker signal than it is capable of producing. Typically, power amplifiers become increasingly linear as they operate further beneath their maximum capabilities, and a greater backoff maintains amplifier operation in the amplifier's more highly linear operating range. Not only does this solution require the use of a more-expensive, higher-power amplifier, but it also usually requires operating the power amplifier in a less efficient operating range, thereby causing the transmitter to consume more power than it might if the amplifier were operated more efficiently. This problem becomes much more pronounced when the communications signal exhibits a high peak-to-average power ratio, such as when several digital communications signals are combined prior to amplification. And, the practice of combining several signals prior to amplification is a common one in cell-site base stations, for example.

Another way to address the consequences of power-amplifier nonlinearity is though digital predistortion. Digital predistortion has been applied to digital communications signals to permit the use of less expensive power amplifiers and also to improve the performance of more expensive power amplifiers. Digital predistortion refers to digital processing applied to a communications signal while it is still in its digital form, prior to analog conversion. The digital processing attempts to distort the digital communications signal in precisely the right way so that after inaccuracies are applied by linear amplification and other analog processing, the resulting communications signal is as precisely accurate as possible. To the extent that amplifier nonlinearity is corrected through digital predistortion, lower-power, less-expensive amplifiers may be used, the amplifiers may be operated at their more-efficient, lower-backoff operating ranges, and spectral regrowth is reduced. And, since the digital predistortion is performed through digital processing, it should be able to implement whatever distortion functions it is instructed to implement in an extremely precise manner and at reasonable cost.

While prior digital predistorting techniques have achieved some successes, those successes have been limited, and the more modern regulatory requirements of tighter spectral-regulatory masks are rendering the conventional predistortion techniques inadequate.

Predistortion techniques require knowledge of the way in which analog components will distort the communications signal in order to craft the proper inverse-predistortion-transfer function that will precisely compensate for distortion introduced by the analog components. The more accurate conventional digital predistortion techniques use a feedback signal derived from the power amplifier output in an attempt to gain this knowledge in real time and to have this knowledge accurately reflect the actual analog components and actual operating conditions.

Conventionally, in response to monitoring this feedback signal, an extensive amount of processing is performed to derive a distortion-transfer function. Then, after deriving the distortion-transfer function, the inverse of the distortion-transfer function is computed and translated into instructions that are programmed into a digital predistorter. In many conventional applications, the transmitter is required to transmit a predetermined sequence of training data to reduce the complexity and improve the accuracy of the extensive processing needed to derive a distortion-transfer function. Less accurate or narrowband conventional predistortion techniques may resort to configuring a digital predistorter as a simple communications-signal filter that is programmed to implement the inverse-transfer-function as best it can. But in many of the more accurate, and usually more expensive, conventional applications, the digital predistorter itself includes one or more look-up-tables whose data serve as the instructions which define the character of the predistortion the digital predistorter will impart to the communications signal.

At the cost of even greater complexity, prior art techniques in high-end applications attempt to compensate for memory effects. In general, memory effects refer to tendencies of power amplifiers to act differently in one set of circumstances than in another. For example, the gain and phase transfer characteristics of a power amplifier may vary as a function of frequency, instantaneous power amplifier bias conditions, temperature, and component aging. In order to address memory effects, predistorter design is typically further complicated by including multiple look-up-tables and extensive processing algorithms to first characterize the memory effects, then derive suitable inverse-transfer functions, and alter predistorter instructions accordingly.

The vast array of conventional predistortion techniques suffers from a variety of problems. The use of training sequences is particularly undesirable because it requires the use of spectrum for control rather than payload purposes, and it typically increases complexity. Generally, increased processing complexity in the path of the feedback signal and in the predistorter design is used to achieve increased accuracy, but only minor improvements in accuracy are achieved at the expense of great increases in processing complexity. Increases in processing complexity for the feedback signal are undesirable because they lead to increased transmitter expense and increased power consumption. Following conventional digital predistortion techniques, the cost of digital predistortion quickly meets or exceeds the cost of using a higher-power amplifier operated at greater backoff to achieve substantially the same result. Thus, digital predistortion has conventionally been practical only in higher-end applications, and even then it has achieved only a limited amount of success.

More specifically, the processing of the feedback signal suffers from some particularly vexing problems using conventional techniques. An inversing operation is conventionally performed to form an inverse-transfer function to use in programming a digital predistorter. While the inversing operation may be somewhat complex on its own, a more serious problem is that it is sensitive to small errors in the feedback signal. Even a small error processed through an inversing operation can result in a significantly inaccurate inverse-transfer function.

Using conventional predistortion techniques, the feedback signal should be captured with great precision and accuracy to precisely and accurately compute the inverse-transfer function. Using conventional techniques, this requires high precision analog-to-digital conversion circuits (A/D) to capture the feedback signal, followed by high resolution, low error, digital circuitry to process the feedback signal. To complicate matters, the feedback signal typically exhibits an expanded bandwidth due to the spectral regrowth caused by power amplifier nonlinearity. To accurately capture the expanded bandwidth of the feedback signal using conventional techniques, the A/D should also consist of high-speed circuits. But such high speed, high-resolution A/D's are often such costly, high-power components that they negate any power amplifier cost savings achievable through digital predistortion in all but the most high-end applications.

In order to avoid the requirement of high-speed, high-resolution A/D's, some conventional predistortion techniques have adopted the practice of processing only the power of the out-of-band portion of the feedback signal. But the power of the out-of-band portion of the feedback signal only indirectly describes analog-component distortion, again causing increased errors and reduced accuracy in inverse-transfer functions.

Even when conventional designs use high-speed, high-resolution A/D's to capture feedback signals, they still fail to control other sources of error that, after an inversion operation, can lead to significant inaccuracy in an inverse-transfer-function. Phase jitter in clocking the A/D adds to error, as does any analog processing that may take place prior to A/D conversion. And, conventional practices call for digital communications signals to be complex signals having in-phase and quadrature components which are conventionally processed separately in the feedback signal prior to A/D conversion. Any quadrature imbalance introduced in the feedback signal by analog processing leads to further error that, after an inversion operation, can cause significant inaccuracy in an inverse-transfer function.

Linear distortion introduced into the communications signal by analog components is believed to be another source of error that plagues conventional digital predistortion techniques. Linear distortion refers to signal inaccuracies that are faithfully reproduced by, or introduced by, the power amplifier and fall in-band. Examples of linear distortion include quadrature gain, phase, and group delay imbalances. And, as the communication signal becomes more wideband, frequency-dependent gain and phase variances assert a greater linear-distortion influence. Linear distortion is typically viewed as being a more benign form of error than nonlinear distortion because it does not lead to spectral regrowth. Typically, linear distortion is compensated for in a receiver after the transmission channel and the receiver's front-end-analog components have added further linear distortions. But in at least one example, a communication system has been configured so that the receiver determines some linear-distortion-correction parameters that are then communicated back to the transmitter, where the transmitter then implements some corrective action.

The reduction of linear distortion in a transmitted communications signal is desirable because it reduces the amount of linear distortion that a receiver must compensate for in the received signal, which leads to improved performance. And, reduction of linear distortion becomes even more desirable as the communications signal becomes more wideband. But using a receiver to specify the corrective action that a transmitter should take to reduce linear distortion is undesirable because it does not separate channel-induced distortion from transmitter-induced distortion. Since multipath usually asserts a dynamic influence on a transmitted RF communications signal as the signal propagates through a channel, such efforts are usually unsuccessful. In addition, it wastes spectrum for transmitting control data rather than payload data, and it requires a population of receivers to have a compatible capability.

Not only is the failure to address linear distortion in conventional transceivers a problem in its own right, but it is believed to lead to further inaccuracy in characterizing nonlinear transfer functions. Most algorithms which transform raw data into transfer functions are based upon amplifier models that are reasonably accurate under controlled conditions. But the use of linearly-distorted signals to derive transfer functions based upon such models, and particularly over wide bandwidths, can violate the controlled conditions. Consequently, the transfer functions derived therefrom are believed to be less accurate than they might be, and any inverse-transfer functions calculated for use in a digital predistorter can be significantly inaccurate as a result.

SUMMARY OF THE INVENTION

It is an advantage of at least one embodiment of the present invention that an improved distortion-managed digital RF communications transmitter and method are provided.

Another advantage of at least one embodiment of the present invention is that a complex-digital-subharmonic-sampling downconverter is adapted to receive a feedback signal from analog-transmitter components to improve accuracy in capturing the feedback signal.

Yet another advantage of at least one embodiment of the present invention is that estimation and convergence algorithms are used to process a feedback signal obtained from analog components to minimize processing complexity while at the same time reducing errors in the feedback signal.

Still another advantage of at least one embodiment of the present invention is that heat-induced memory effects are compensated for with little increase in complexity.

Another advantage of at least one embodiment of the present invention is that a linear predistorter is trained to compensate for linear distortion prior to training a nonlinear predistorter to compensate for nonlinear distortion to improve accuracy in the training of the nonlinear predistorter.

These and other advantages are realized in one form by an improved method of managing distortion in a digital communications transmitter in which at least a portion of the distortion is introduced by analog-transmitter components. The method calls for obtaining a forward-data stream configured to convey digital information. A linear predistorter is trained to compensate for linear distortion introduced by the analog-transmitter components. And, a nonlinear predistorter is trained to compensate for nonlinear distortion introduced by the analog-transmitter components.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

FIG. 4 shows a flowchart of a transmission-distortion-management process performed by the transmitter depicted in FIG. 1;

FIG. 5 shows a flowchart of a subprocess of the process depicted in FIG. 4, wherein this subprocess compensates for linear distortion introduced upstream of a high power amplifier (HPA);

DETAILED DESCRIPTION OF THE PREFERRED EMBODIMENTS

Figure 1:
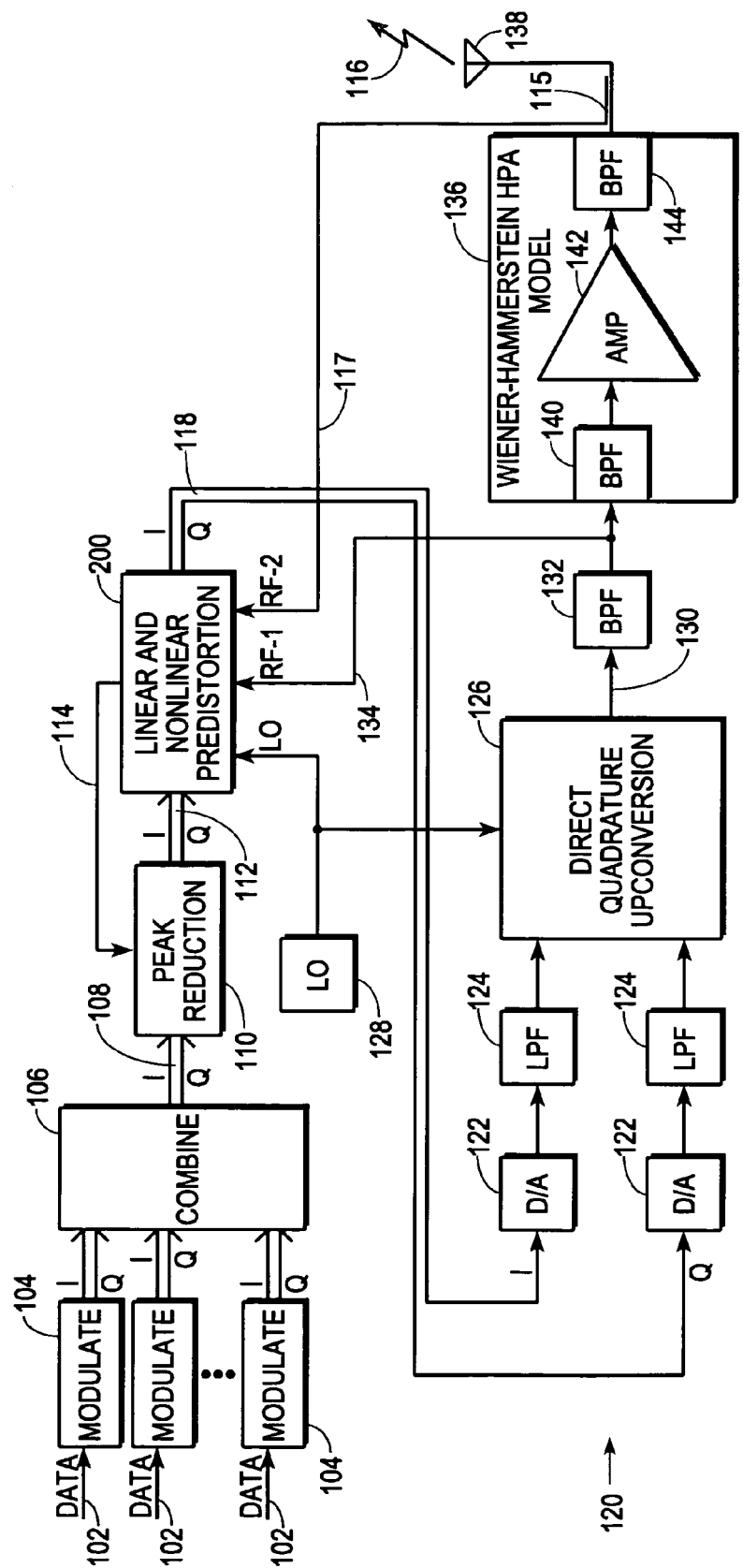
FIG. 1 shows a block diagram of a digital communications transmitter configured in accordance with the teaching of the present invention.

FIG. 1 shows a block diagram of a digital-communications radio-frequency (RF) transmitter 100 configured in accordance with the teaching of the present invention. Transmitter 100 is the type of transmitter that may be used at a cellular telephony, cell-site base station, but transmitter 100 may be used in other applications as well.

In transmitter 100 a plurality of digital-data streams 102 is provided to a corresponding plurality of digital modulators 104. In a cell-site base station application, data streams 102 may convey information to be transmitted to a plurality of different users. The different streams 102 may bear some relation to one another, or they may bear no relation whatsoever.

Modulators 104 may implement any type of digital modulation, but the benefits of the present invention are best appreciated with forms of modulation where both amplitude and phase are used to digitally convey the information. Such types of modulation typically require the use of linear high-power amplifiers (HPA's). Examples of such types of modulation include any type of quadrature-amplitude modulation (QAM), code-division-multiple-access (CDMA), and orthogonal-frequency-division modulation (OFDM). In the preferred embodiment, the modulated data output from modulators 104 digitally conveys information using complex data streams. Those skilled in the art will appreciate that complex-data streams include two parallel streams. Using a conventional nomenclature, FIG. 1 depicts one of the streams as an in-phase (I) stream and the other as a quadrature (Q) stream, reflecting an orthogonal relationship the two streams will share as they are processed and combined together downstream. Although not specifically shown, modulators 104 may include pulse shaping filters that are configured to minimize inter-symbol interference (ISI) in a manner well-understood by those skilled in the art, and other forms of post-modulation signal processing.

In one preferred embodiment, modulators 104 couple to a combining section 106 in which the plurality of independently-modulated complex-data streams are combined together into a single digital communications signal, referred to herein as complex-forward-data stream 108. For the purposes of this description, complex-forward-data stream 108 and all variants thereof produced by downstream processing between combining section 106 and an antenna from which transmission occurs are referred to as forward-data streams to distinguish them from return-data streams that are discussed below and which propagate in the opposite direction. Even if data streams 102 were narrowband-data streams, the combined complex-forward-data stream 108 may be viewed as a wideband-data stream. One of the consequences of combining the separate modulated-data streams is that the peak-to-average ratio of complex-forward-data stream 108 increases, placing greater demands on linear amplification to be performed downstream.

An output of combining section 106 couples to an input of a peak-reduction section 110. Peak-reduction section 110 reduces the peak-to-average ratio of forward-data stream 108 so that a resulting complex-peak-reduced-forward-data stream 112 will place fewer demands on linear amplification to be performed downstream. In the preferred embodiments, peak-reduction section 110 uses a peak-reduction or crest-reduction technique that introduces only in-band distortion on forward-data stream 108. Consequently, no significant spectral regrowth should occur in complex-peak-reduced-forward-data stream 112 or elsewhere as a result of applying peak reduction.

In addition, peak-reduction section 110 desirably applies peak reduction in a controllable manner so as to respond to a peak-reduction-feedback signal 114. In particular, feedback signal 114 may provide a residual-nonlinear-EVM value that may be transformed into a threshold value by peak-reduction section 110. The threshold value indicates the minimum magnitude that needs to be exhibited by forward-data stream 108 before any peak reduction will be applied. Typically, greater amounts of peak reduction will be applied to forward-data stream 108 as the magnitude of forward-data stream 108 exceeds this threshold by greater amounts. An increase in peak reduction can be achieved by lowering the magnitude threshold where peak reduction is applied to forward-data stream 108, and it will have the effect of introducing greater in-band distortion into peak-reduced-forward-data stream 112. Suitable peak-reduction techniques are described in U.S. Pat. Nos. 6,104,761 and 6,366,619, both of which are incorporated herein by reference, but techniques other than those described therein may be used as well.

In the preferred embodiment, feedback signal 114 indicates the amount of residual nonlinear distortion in an RF-communications signal 116 transmitted from transmitter 100. The development of feedback signal 114 is discussed below. In one preferred embodiment, peak-reduction section 110 is operated so that the amount of peak reduction applied to forward-data stream 108 increases when an excessive amount of nonlinear distortion is present, as compared with a predetermined value. Desirably, transmitter 100 is designed so that under normal, steady-state, operating conditions the amount of nonlinear distortion in RF-communications signal 116 is not excessive and the total error-vector magnitude (EVM) is slightly less that the maximum allowed by a system specification. But abnormal operating conditions may lead to excessive nonlinear distortion, which in turn could result in spectral regrowth that exceeds regulatory requirements and EVM specifications.

Accordingly, feedback signal 114 has the ability to manage the amount of distortion in RF-communication signal 116 and cause that distortion to be more in-band and less out-of-band, regardless of other operating conditions. Feedback signal 114 permits peak-reduction section 110 to increase peak reduction, which then causes HPA 136 to operate at a greater backoff. Operating HPA 136 at greater backoff will result in reduced nonlinear distortion and reduced out-of-band emissions. But by increasing peak reduction in-band distortion will also increase. Thus, overall distortion may remain roughly constant, but its character will be shifted from out-of-band to in-band.

Peak-reduction section 110, if present, serves as a source of forward-data stream 112 for a linear-and-nonlinear-predistortion circuit 200. Predistortion circuit 200 uses a variety of features to intentionally introduce both linear distortion and nonlinear distortion into forward-data stream 112 through the use of digital processing. This variety of features is discussed in detail below. It is predistortion circuit 200 that generates feedback signal 114. After processing in predistortion circuit 200, forward-data-stream 112 becomes a complex-quadrature-balanced-equalized-forward-data stream 118. To the extent that forward-data streams 108 and 112 represent wideband signals, forward-data stream 118 now represents a super-wideband signal. Forward-data stream 118 passes to analog components 120 of transmitter 100. Forward-data stream 118 conveys not only the baseband communications signal, but also conveys inverse-intermodulation distortion introduced by predistortion circuit 200 that will compensate for nonlinear distortions to be introduced by analog components 120.

Analog components 120 include separate digital-to-analog converters (D/A's) 122 for each leg of complex-forward-data stream 118. D/A's 122 convert forward-data stream 118 from digital to analog signals. Subsequent processing of the forward-communications signal will be analog processing and subject to the inaccuracies characteristic of analog processing. For example, the two different D/A's 122 may not exhibit precisely the same gain and may introduce slightly different amounts of delay. Such differences in gain and delay can lead to linear distortion in the communication signal. Moreover, so long as the different legs of the complex signal are processed separately in different analog components, the components are likely to apply slightly different frequency responses so that linear distortion is worsened by the introduction of frequency-dependent gain and phase imbalances. And, the frequency-dependent gain and phase imbalances worsen as the bandwidth of the communication signal widens.

The two complex legs of the analog signal pass from D/A's 122 to two low-pass filters (LPF's) 124. LPF's 124 can be the source of additional linear distortion by applying slightly different gains and phase shifts in addition to slightly different frequency-dependent characteristics. From LPF's 124 the two complex legs of the analog signal pass to a direct quadrature upconversion section 126. Upconversion section 126 mixes the two complex legs with a local-oscillator signal exhibiting a local-oscillator frequency and obtained from a local oscillator 128 in a manner known to those skilled in the art. Additional linear distortion in the form of gain and phase imbalance may be introduced, and local-oscillator leakage may produce an unwanted DC offset. In addition, upconversion section 126 combines the two distinct legs of the complex signal and passes the combined signal, now an RF-analog signal 130, to a band-pass filter (BPF) 132. Section 126 preferably performs a direct upconversion for cost reasons, at least up to frequencies less than around 2.5 GHz. For higher frequencies multiple stages of upconversion may be used.

BPF 132 is configured to block unwanted sidebands in RF-analog signal 130, but will also introduce additional phase delay into the communications signal, now referred to as RF-analog signal 134. RF-analog signal 134 drives a power amplifier 136, also conventionally called a high-power amplifier (HPA). HPA 136 couples to an antenna 138 and produces an amplified-RF-analog signal, referred to above as RF-communications signal 116.

HPA 136 is likely to be the source of a variety of linear and nonlinear distortions introduced into the communications signal. FIG. 1 depicts HPA 136 using the Wiener-Hammerstein RF-amplifier model, which may be used to explain some of these distortions, at least for the controlled conditions of ideal signals. According to the Wiener-Hammerstein HPA model, HPA 136 acts like an input band-pass filter (BPF) 140, followed by a memoryless nonlinearity, labeled amp 142 in FIG. 1, which is followed by an output band-pass filter (BPF) 144. Amp 142 generates an output signal that may be a higher-order complex polynomial function of its input. Each of BPF's 140 and 144 may introduce linear distortion, but probably little significant nonlinear distortion. On the other hand, amp 142 is a significant source of nonlinear distortion.

In the preferred embodiment, linear-and-nonlinear-predistortion circuit 200 receives at least three analog input signals. One signal is the local-oscillator signal used by upconversion section 126 for upconversion. Other analog inputs are feedback signals derived from RF-analog signal 134, which serves as the input signal to HPA 136, and RF-communications signal 116 through a directive coupler 115, which serves as the output signal from HPA 136.

Through monitoring these feedback signals, linear-and-nonlinear-predistortion circuit 200 learns how to apply predistortion so as to minimize the linear, then the nonlinear distortion. While a variety of different distortion sources are present, the physical attributes of the analog components that cause the distortions tend to change slowly. This allows circuit 200 to implement estimation-and-convergence algorithms to determine suitable predistortion characterizations and to tolerate slow convergence rates in such algorithms. The use of estimation-and-convergence algorithms reduces processing complexity and also reduces sensitivity to errors in the feedback signals. Moreover, the use of slow convergence rates allows circuit 200 to reduce the effective-error levels of the feedback signals so that accurate predistortion characterizations are obtained. Since errors in the feedback signals can be tolerated, the feedback signals may be processed using low resolution circuits, thereby achieving a circuit component count and power savings.

Figure 2:
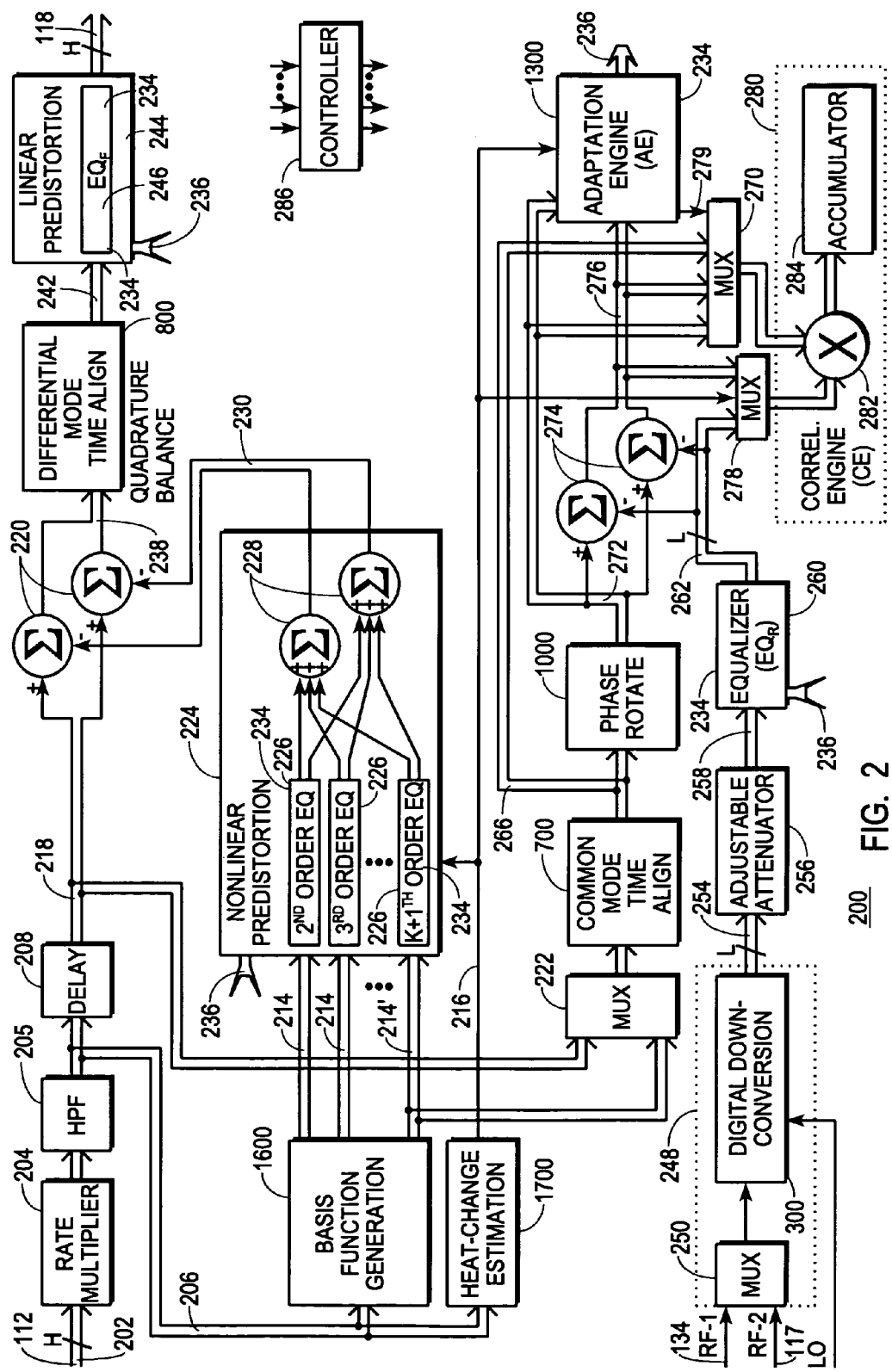
FIG. 2 shows a block diagram of a linear-and-nonlinear-predistortion section of the transmitter depicted in FIG. 1.

FIG. 2 shows a block diagram of linear-and-nonlinear-predistortion circuit 200 of transmitter 100. Complex-forward-data stream 112, which is configured to convey digital data, is applied at an input port 202 of circuit 200. Compared to a return-data steam discussed below, forward-data stream 112 exhibits a higher resolution, as indicated in FIG. 2 by the letter "H". Those skilled in the art will appreciate that the resolution is determined, at least in part, by the number of bits with which each sample in forward-data stream 112 is described. A higher-resolution-data stream is usually conveyed using more bits per sample than a lower-resolution-data stream. Likewise, forward-data stream 112 exhibits a relatively low error level from quantization noise, phase jitter, and the like. As discussed above, any signal flowing toward analog components 120 that is based on forward-data stream 112 is also considered to be a form of the forward-data stream. As forward-data stream 112 flows through predistortion circuit 200, it retains its high resolution, low error level characteristic.

In the preferred embodiment, forward-data stream 112 is routed to a rate multiplier 204. In this preferred embodiment, forward-data stream 112 conveys only a baseband digital communications signal and needs to flow at a data rate that supports the Nyquist criteria for the baseband digital communications signal. But in one preferred embodiment, subsequent processing of forward-data stream 112 will introduce higher-frequency components to compensate for nonlinear distortion. Thus, rate multiplier 204 steps up the data rate to be at least equal to and preferably greater than the Nyquist rate for the highest-frequency components that will be introduced. At this point, the forward-data-stream may be thought of as a super-wideband data stream. Rate multiplier 204 may be implemented using interpolators in a manner well-known to those skilled in the art. Or, rate multiplier 204 may be omitted altogether if nonlinear compensation is to be omitted.

The forward data stream output from multiplier passes to a high-pass filter (HPF) 205 configured merely to remove DC. High-pass filter 205 desirably has substantially the same filtering characteristics as another high-pass filter inserted in the return-data stream, as discussed below. High-pass filter 205 may alternatively be located prior to rate multiplier 204.

An increased-rate-complex-forward-data stream 206 flows from high-pass filter 205 to a delay section 208, a basis-function-generation section 1600, and a heat-change-estimation section 1700. Basis-function-generation section 1600 is used in connection with nonlinear compensation and may be omitted if nonlinear compensation is to be omitted.

Basis-function-generation section 1600 generates a plurality of complex-basis-function-data streams 214. Each complex-basis-function-data stream 214 is responsive to $X(n) \cdot |X(n)|^K$, where X(n) represents the forward-data stream 206 received by section 1600, and K is an integer number greater than or equal to one. Thus, section 1600 generates a variety of higher-order harmonics of and from the forward-data stream 206. A complex-basis-function-data stream 214' supplies the highest-ordered-basis-function-data stream 214 (i.e., has the greatest value of K). Data stream 214' is routed to a first data input of a multiplexer (MUX) 222. Basis-function-generation section 1600 is discussed below in more detail in connection with FIGS. 15 and 16.

Likewise, heat-change-estimation section 1700 is used in connection with nonlinear compensation and may be omitted if nonlinear compensation is to be omitted. Generally, heat-change-estimation section 1700 generates a delta-heat signal (Δ-Heat) 216 that describes the relative power in the forward-data stream 206 in a way that characterizes the instantaneous change in heat buildup in HPA 136 relative to a longer-term-heat average. Delta-heat signal 216 is then used to influence basis-function-data streams 214 to compensate for the heat memory effect of a typical HPA 136. Heat-change-estimation section 1700 is discussed below in more detail in connection with FIGS. 15 and 17.

In the preferred embodiment, all basis-function-data streams 214 exhibit equal delay in basis-function-generation section 1600. Delay section 208 inserts a constant delay equal to this basis-function delay. Accordingly, a complex-forward-data stream 218 output from delay section 208 has the same timing as each of basis-function-data streams 214, including highest-order-basis-function-data stream 214'. The complex-forward-data stream 218 output from delay section 208 is routed to a combining circuit 220 and to a second data input of multiplexer 222. Combining circuit 220 is depicted in FIG. 2 as a complex subtracting circuit having one subtraction element for each leg of the complex signal path. Complex-forward-data stream 218 is routed to positive inputs of the subtraction elements.

All complex-basisfunctiondata streams 214 are routed to a nonlinear predistorter 224, which may be omitted if nonlinear compensation is to be omitted from transmitter 100. Nonlinear predistorter 224 includes a plurality of equalizers (EQ) 226, with one equalizer 226 being provided for each complex-basis-function-data stream 214. FIG. 2 labels equalizers 226 as being associated with a $2_{nd}$-order basis function, a $3_{rd}$-order basis function, and so on up to a $(K+1)_{th}$-order basis function. Each of equalizers 226 is a complex equalizer, like an equalizer 1200 shown in more detail in FIG. 12, and outputs from each equalizer 226 are combined together in adders 228 to form a complex-filtered-basis-function-data stream 230. Data stream 230, which serves as a nonlinear-predistorted-compensation stream, is routed to the subtraction inputs of combining circuit 220.

For the purposes of this description, an equalizer, such as any of equalizers 226, is a programmable filter. The filter is programmed by specifying its filter coefficients to define how it will alter the signal it processes. In the preferred embodiments, a wide range in filter complexity is contemplated. Each of equalizers 226 may have as few as one tap or any number of taps greater than that. An adaptive equalizer is an equalizer configured to determine its own filter coefficients and to continuously alter its filter coefficients, while a non-adaptive equalizer is an equalizer which accepts filter coefficients programmed into it but does not alter those filter coefficients until they are updated by further programming. But as discussed below, in some locations delta-heat signal 216 may cause some alteration in filter coefficients programmed into a non-adaptive equalizer.

In the preferred embodiment, equalizers 226 are non-adaptive equalizers. But when coupled to an adaptation engine 1300, the combination of an equalizer 226 with adaptation engine 1300 forms an adaptive equalizer. Each of equalizers 226, other equalizers included in linear-and-nonlinear-predistortion circuit 200, and adaptation engine 1300 belong to an equalizer section 234. In the preferred embodiment, adaptation engine 1300 is selectively coupled to and decoupled from the various equalizers within equalizer section 234 from time to time to determine filter coefficients through the implementation of an estimation-and-convergence algorithm. FIG. 2 depicts this selective coupling and decoupling through feature 236 in nonlinear predistorter 224 and in adaptation engine 1300. Delta-heat signal 216 is one of the inputs to adaptation engine 1300, and delta-heat signal 216 is also input to nonlinear predistorter 224. Equalizers 226, adaptation engine 1300, and the estimation-and-convergence algorithm implemented therewith are discussed below in more detail in connection with FIGS. 11–13.

An output of combining circuit 220 provides a complex-nonlinear-predistorted-forward-data stream 238. Forward-data stream 238 drives a differential-mode-time-alignment section 800 in one embodiment of the present invention. Time-alignment section 800 may be omitted if linear compensation is to be omitted from transmitter 100. Time-alignment section 800 inserts different amounts of delay into the I and Q complex legs of forward data stream 238 to compensate for an opposing differential time delay that may be introduced through analog components 120. Time-alignment section 800 is discussed in more detail below in connection with FIGS. 5 and 8.

An output of time-alignment section 800 produces a complex-differential-time-aligned-forward-data stream 242 that drives a linear predistorter 244. Alternatively, time-alignment section 800 may be located after linear predistorter 244, rather than before as depicted in FIG. 2, if desired. And, linear predistorter 244 may be omitted altogether if linear compensation is to be omitted from transmitter 100.

Linear predistorter 244 performs a variety of adjustments on the forward-data stream 242. For example, linear predistorter 244 performs quadrature-balance functions and therefore serves as a quadrature-balance-adjustment section. Thus, linear predistorter 244 introduces gain and phase adjustments into the I and Q legs of complex-forward-data stream 242, and introduces such adjustments independently for the I and Q legs so that quadrature balance can be affected. In addition, linear predistorter 244 compensates for frequency-dependent quadrature gain and phase imbalances. Accordingly, even wideband and the above-discussed super-wideband communications signal are quadrature balanced through linear predistorter 244.

In the preferred embodiment, linear predistorter 244 is implemented using a complex equalizer 246, which may be configured as equalizer 1200 but most likely has a greater number of taps. If the number of taps is sufficiently generous, then differential mode time alignment section 800 may be omitted altogether. Equalizer 246 is labeled $EQ_F$, with the subscript "F" indicating that equalizer 246 filters the forward-data stream. As discussed above in connection with equalizers 226, equalizer 246 serves as one part of equalizer section 234. And, equalizer 246 is desirably a non-adaptive equalizer that, when coupled through feature 236 to adaptation engine 1300, becomes an adaptive equalizer. By properly programming forward-filter coefficients (i.e., filter coefficients for forward equalizer $EQ_F$) into equalizer 246, linear predistorter 244 compensates for linear distortion introduced by analog components 120. The forward-filter coefficients are determined through a training process that is discussed below in connection with FIGS. 5 and 11–14. When trained, the forward-filter coefficients serve as quadrature-balance coefficients or parameters in addition to correcting for frequency-dependent phase and gain imbalance and distortion between the I and Q legs.

Linear predistorter 244 generates complex-quadrature-balanced-equalized-forward-data stream 118 which is passed to analog components 120. Forward-data stream 118 desirably maintains the high-resolution, low-error-level characteristic that it demonstrated upstream. It has been distorted in the preferred embodiment to compensate for both nonlinear and linear distortions that have not yet been introduced into the communications signal but will be introduced by analog components 120. Moreover, it is desirably provided at a rate that supports the above-discussed super-wideband that includes the baseband signal plus higher harmonics. But other embodiments may nevertheless benefit from compensating for only linear distortions or compensating for only nonlinear distortions.

Referring to FIG. 1, feedback from analog components 120 is obtained through feedback signals 117 and 134. Feedback signal 117 is derived from the RF-analog signal output by HPA 136, and feedback signal 134 is derived from the RF-analog signal input to HPA 136. Back on FIG. 2 then, feedback signals 117 and 134 are supplied to a feedback section 248 of linear-and-nonlinear-predistortion circuit 200 at a multiplexer 250. Feedback section 248 also includes a digital-downconversion section 300, which receives an output from multiplexer 250. Downconversion section 300 also receives substantially the same local-oscillator signal from local oscillator 128 that is used by upconversion section 126. Downconversion section 300 first downconverts feedback signal 134 for use in training linear-and-nonlinear-predistortion circuit 200 to compensate for various forms of linear distortion introduced into the signal input to HPA 136. Then, downconversion section 300 downconverts feedback signal 117 for use in training linear-and-nonlinear-predistortion circuit 200 to compensate for various forms of linear and nonlinear distortion introduced into the signal output from HPA 136. Downconversion section 300 is discussed in more detail below in connection with FIG. 3.

Downconversion section 300 generates a complex return-data stream 254. As indicated by the letter "L" in FIG. 2, return-data stream 254 exhibits a low resolution and high-error level, compared to the various forms of the forward-data stream. For purposes of this discussion, all data streams that propagate away from analog components 120 and are based on return-data stream 254 are considered to be a form of the return-data stream.

Complex-return-data stream 254 drives an adjustable attenuator circuit 256. Adjustable attenuator circuit 256 desirably serves as a fine adjustment or vernier that is programmed or otherwise determines how to attenuate the signal level of return-data stream 254 to compensate for the gain inserted into the forward-propagating communication signal by HPA 136, and attenuation provided by coupler 115. Adjustable attenuation circuit 256 may be implemented using a complex multiplier.

Adjustable attenuator 256 produces an attenuated-complex-reverse-data stream 258 that is routed to a complex equalizer 260, which may be configured like equalizer 1200 but most likely has a greater number of taps. FIG. 2 applies the label $EQ_R$ to equalizer 260, with the subscript "R" indicating that equalizer 260 filters the return-data stream. As discussed above in connection with equalizers 226 and 246, equalizer 260 serves as one part of equalizer section 234. And, equalizer 260 is desirably a non-adaptive equalizer that, when coupled through feature 236 to adaptation engine 1300, becomes an adaptive equalizer. By properly programming return filter coefficients (i.e., filter coefficients for return equalizer $EQ_R$) into equalizer 260, linear distortion that is introduced primarily by HPA 136 itself is compensated so that this form of linear distortion does not contaminate subsequent training that will take place to compensate for nonlinear distortion. The return-filter coefficients are determined through a training process that is discussed below in connection with FIGS. 11–14.

Equalizer 260 generates an equalized-complex-return-data stream 262 that maintains the relatively low resolution and high error level discussed above. The use of low resolution for processing the return-data stream leads to power and component savings.

An output of multiplexer 222 drives a common-mode-time-alignment section 700. Time-alignment section 700 inserts the same amount of delay into the I and Q complex legs of either the forward-data stream 218 or highest-order-basis-function-data stream 214', depending upon which stream has been selected at multiplexer 222. And, the amount of delay that time-alignment section 700 inserts is programmable. Time-alignment section 700 generates a delayed-complex-forward-data stream 266. Time-alignment section 700 is programmable so that stream 266 may be brought into temporal alignment with the return-data stream 262. Time-alignment section 700 is discussed in more detail below in connection with FIGS. 5–7.

Delayed-complex-forward-data stream 266 is routed to a phase-rotate section 1000 and to a first data input of a multiplexer (MUX) 270. Phase-rotate section 1000 rotates delayed-complex-forward-data stream 266 by a programmable amount and generates an aligned-complex-forward-data stream 272. Phase-rotate section 1000 is programmable so that stream 272 may be brought into phase-alignment with return-data stream 262 to compensate for the delay imposed by filters 132, 140, and/or 144 of analog components 120. Phase-rotate section 1000 is discussed in more detail below in connection with FIGS. 5 and 9–10.

Aligned-complex-forward-data stream 272 is routed to adaptation engine 1300 and to a second data input of multiplexer 270. In addition, aligned-complex-forward-data stream 272 and equalized-complex-return-data stream 262 are routed to a complex-combining circuit 274, depicted in FIG. 2 as two subtraction elements. Combining circuit 274, subtracts return-data stream 262 from forward-data stream 272 to form an error signal or error stream 276. Both equalized-return-data stream 262 and error stream 276 are routed to data inputs of a multiplexer (MUX) 278, as is delta-heat signal 216. And, error stream 276 is routed to a third data input of multiplexer 270 and to adaptation engine 1300, while a delta-coefficient (Δ-COEFF) signal 279 generated by adaptation engine 1300 is routed to a fourth data input of multiplexer 270.

Outputs from multiplexers 270 and 278 are each routed to a correlation engine 280. In particular, outputs from multiplexers 270 and 278 are supplied to different data inputs of a complex multiplier 282, and a complex output from multiplier 282 couples to an input of an accumulator 284. Through multiplexers 270 and 278, a variety of different data streams may be correlated together in correlation engine 280. Multiplier 282 performs a basic correlation operation, and the correlation results are integrated in accumulator 284. One of the data streams correlated by correlation engine 280 is based upon the return-data stream and exhibits the low-resolution and high-error level discussed above.

In the preferred embodiment, accumulator 284 desirably permits a massive amount of accumulation (e.g., between $2^{16}$ and $2^{24}$ samples) so that a multiplicity of samples are processed before making decisions based on correlation results. That way the effects of the low resolution and high-error level of the return-data stream are negated so that an effective-error level resulting after the integration is less, and can even be much less, than the error level of the return-data stream. Generally, the noise variance of a sampled signal decreases as the square-root of the number of samples averaged together increases, so long as the "noise" is more or less uncorrelated. Thus, for example, the effective-error level of the return stream may be decreased by an amount equivalent to increasing resolution 10 bits (i.e., approximately 60 dB) over the error level of the return stream by accumulating correlations over $2^{20}$, or roughly $10^6$, samples.

FIG. 2 depicts a controller 286 with numerous inputs and outputs. Although not explicitly shown to simplify the block diagram of FIG. 2, these inputs and outputs couple to the various subsections of linear-and-nonlinear-predistortion circuit 200 to provide controlling data thereto and to read data therefrom. For example, controller 286 controls multiplexers 278 and 270 to specify which data streams or signals are correlated together in correlation engine 280, and an output from accumulator 284 of correlation engine 280 is routed to controller 286. Controller 286 may be provided using any of a variety of conventional microprocessors or microcontrollers in a manner well-understood by those skilled in the art. As such, controller 286 may perform tasks defined by computer software instructions stored in a memory portion (not shown) of controller 286. In one embodiment, controller 286 may provide control functions for linear-and-nonlinear-predistortion circuit 200 as well as other sections of transmitter 100. Controller 286 and the tasks performed by linear-and-nonlinear-predistortion circuit 200 in response to the controlling influence of controller 286 are discussed in more detail below in connection with FIGS. 4–6, 9, 11, and 14–15.

Figure 3:
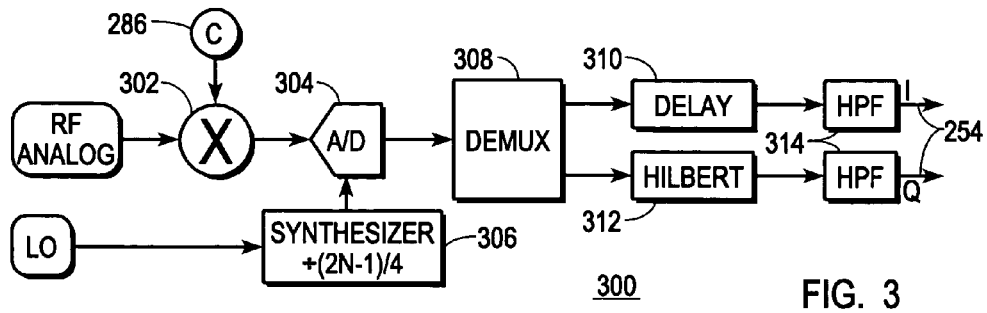
FIG. 3 shows a block diagram of a digital downconversion section suitable for use in the linear-and-nonlinear-predistortion section of the transmitter depicted in FIG. 1.

FIG. 3 shows a block diagram of a digital-downconversion section 300 suitable for use in linear-and-nonlinear-predistortion circuit 200 of transmitter 100.

Section 300 receives an RF-analog input from multiplexer 250, and routes that input to a programmable-analog attenuator 302. Control inputs of attenuator 302 determine the amount of attenuation provided by attenuator 302 and are provided by controller (C) 286. Attenuator 302 desirably serves as a coarse adjustment that operates in conjunction with digital adjustable attenuator 256 to attenuate the signal level of return-data stream 254 to compensate for the gain inserted into the forward-propagating communication signal by HPA 136 and attenuation provided by coupler 115.

An output of attenuator 302 couples to an input of an analog-to-digital converter (A/D) 304. In addition, the same local-oscillator signal used by upconversion section 126 is input to section 300 and received at a synthesizer 306. Synthesizer 306 is desirably configured to multiply the local-oscillator frequency by four and divide the resulting product by an odd number, characterized as 2N±1, where N is a positive integer chosen to satisfy the Nyquist criteria for the super-wideband signal discussed above, and is usually greater than or equal to ten. As a result, A/D 304 performs a direct downconversion through subharmonic sampling.

The direct-subharmonic-sampling-downconversion process performed by A/D 304 requires that A/D 304 be capable of high-speed conversions. In addition, the subharmonic sampling process tends to sum thermal noise from several harmonics of the baseband into the resulting baseband signal, thereby increasing noise over other types of downconversion. While these factors pose serious problems in many applications, they are no great burden in section 300 because, as discussed above, only low resolution is required. Moreover, the low resolution demanded of A/D 304 likewise places no particular burden on the phase-noise in the clock signal generated by synthesizer 306 or aperture-jitter characteristic of A/D 304. The low resolution requirement is permitted due to the operation of various estimation-and-convergence algorithms, discussed below, that result in an averaging effect which reduces the impact of noise, phase jitter, and/or aperture jitter.

In particular, A/D 304 is required only to provide a resolution at most four bits less than the forward resolution exhibited by the forward-data stream 112 flowing through linear-and-nonlinear-predistortion circuit 200. In one embodiment, A/D 304 may be implemented by providing only one or two bits of resolution. As discussed above, various techniques, such as estimation-and-convergence algorithms and integration, are used to translate increased arithmetic processing time into a reduced effective-error level for the return-data stream. Thus, the low resolution is effectively increased by processing a multiplicity of samples before decisions are made based on feedback signals, and no single sample or even small or medium size groups of samples have a significant influence by themselves on decisions made based on the feedback signals. High-quantization error and high-thermal-noise error pose no particular problem for linear-and-nonlinear-predistortion circuit 200.

In the preferred embodiment, linear-and-nonlinear-predistortion circuit 200 is provided on a common semiconductor substrate that may be predominantly manufactured using a CMOS process. But the high speed requirements of A/D 304 and synthesizer 306 may be provided for by using a SiGe process which is compatible with CMOS processing.

The processing of the feedback signal upstream of A/D 304 has been performed using analog techniques and is therefore subject to the inaccuracies characteristic of analog processing. But A/D 304 provides a digital-data stream, and subsequent processing will not be subject to analog inaccuracies. That digital-data stream characterizes the complex feedback signal as a combination signal in which the I and Q legs are combined together. Subsequent processing is performed to appropriately position the subharmonic of interest at baseband and to separate the I and Q legs of the complex signal. Although processing is subsequently performed independently on the I and Q legs of the complex signal, such processing is performed digitally, so no linear distortion is introduced due to quadrature imbalances and/or diverse frequency-dependent gain and phase characteristics.

In particular, the digital-data stream output from A/D 304 is routed to a demultiplexer (DEMUX) 308, which separates the stream into even-and-odd-sample-data streams. One of the these even-and-odd-sample-data streams is merely delayed in a delay element 310, while the other is transformed in a Hilbert-transformation section 312. Outputs from element 310 and section 312 are filtered in high-pass filters (HPF's) 314 to remove DC, where they then collectively serve as complex-return-data stream 254. Of course, the rates of the data streams slow as they propagate through section 300, and clock signals are appropriately divided down (not shown) to support the decreasing data rates. It is high-pass filters 314 that are matched by high-pass filter 205.

FIG. 3 depicts one form of a complex-digital-subharmonic-sampling downconverter suitable for use as digital-downconversion section 300. But those skilled in the art can devise other forms of direct-digital-subsampling downconversion that will also be acceptable. While direct downconversion is desirable because it does not introduce different analog inaccuracies into the I and Q legs which can lead to linear distortion or other analog inaccuracies that can lead to nonlinear distortion, in higher-frequency applications (e.g., greater than 2.5 GHz) downconversion may be performed in two stages, with the first stage being an analog downconversion. In this situation distortion introduced by the first analog downconversion stage will be less significant because it will be applied over a significantly narrower bandwidth as a percentage of the carrier frequency.

FIG. 4 shows a flowchart of a transmission-distortion-management process 400 performed by transmitter 100. Process 400, as well as the subprocesses and sub-subprocesses included therein, are carried out under the control of controller 286 through the performance of software in a manner well-understood by those skilled in the art.

Process 400 may be initiated immediately after transmitter 100 is energized, or at any time while transmitter 100 is operating. Generally, analog components 120 introduce distortion into RF-communications signal 116 from a variety of sources. In other words, RF-communications signal 116 may be viewed as exhibiting a variety of different types of distortions rather than a single distortion. Not only is there a distinction between linear and nonlinear distortions, but linear distortions have a variety of different causes. Process 400 trains linear-and-nonlinear-predistortion circuit 200 to compensate for the worst of these distortions on a one-by-one basis. Training is performed using estimation-and-convergence algorithms so that complex processing may be avoided and so that sensitivity to error in the feedback signal is reduced. But the calculation of forward transfer functions and inversing operations are avoided.

Process 400 first performs a subprocess 500 to compensate for linear distortion introduced upstream of HPA 136.

FIG. 5 shows a flowchart of subprocess 500. Subprocess 500 first performs an initialization task 502. Task 502 initializes the various sections of linear-and-nonlinear predistortion circuit 200 so that training may begin. In particular, forward equalizer 246 and reverse equalizer 260 are both programmed with filter coefficients that cause them to merely pass, and not alter, the forward and reverse data streams, respectively. Adaptation engine 1300 is decoupled from all equalizers. Adjustable attenuators 256 and 302 are programmed to apply a gain of one (i.e., neither gain nor attenuation). A selection-control value is provided to multiplexer 250 to route RF-analog feedback signal 134 (RF-1) to downconversion section 300. Basis functions are zeroed by controlling nonlinear predistorter 224 to produce constant zero values regardless of input. Multiplexer 222 is controlled to route forward-data stream 218 to time-alignment section 700. Correlation engine (CE) 280 is configured to correlate "ideal"-delayed-forward-data stream 266 and return-data stream 262 by appropriate selection values being supplied to multiplexers 278 and 270. Delayed-forward-data stream 266 is considered to be ideal because it has not been distorted either by predistortion circuit 200 or analog components 120. Time alignment implemented by time-alignment sections 700 and 800 is set to mid-range values, and the processing of delta-heat signal 216 is disabled. At this point, linear-and-nonlinear-predistortion circuit 200 is prepared to begin training for linear compensation.

Following task 502, a task 504 invokes a subprocess 600 to implement a time-alignment-estimation-and-convergence algorithm. In particular, subprocess 600 implements this algorithm in task 504 for a programmable delay element provided by common-mode-time-alignment section 700. Thus, subprocess 600 will now temporally align delayed-complex-forward-data stream 266 with the complex-return-data-stream 262. Following task 504, a task 506 invokes subprocess 600 again, or an equivalent process, to again implement the time-alignment-estimation-and-convergence algorithm, but this time for a programmable delay element provided by differential-mode-time-alignment section 800. During task 506 subprocess 600 temporally aligns the I and Q legs of complex-forward-data stream 238.

Figure 6:
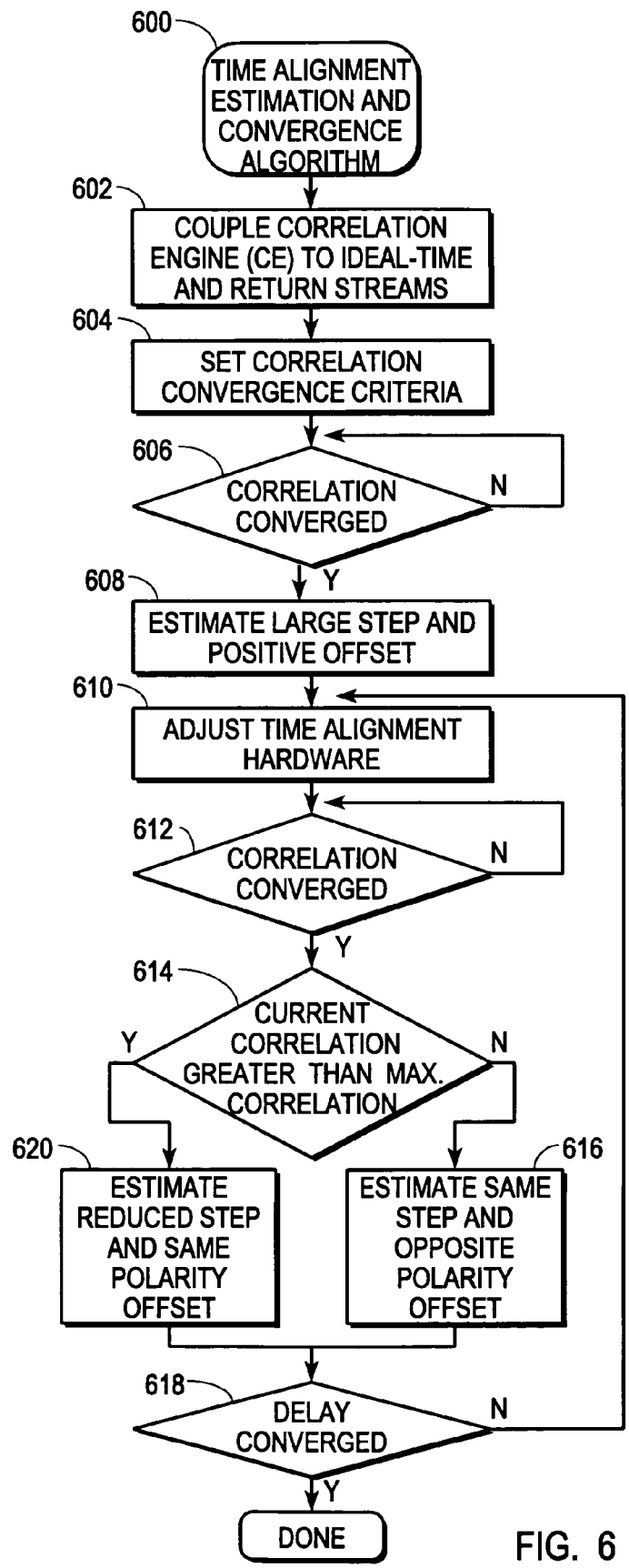
FIG. 6 shows a flowchart of a subprocess of the subprocesses depicted in FIGS. 5 and 14, wherein this subprocess implements one example of a time-alignment-estimation-and-convergence algorithm.

FIG. 6 shows a flowchart of a subprocess 600 that may be applied during each of tasks 502 and 504 in connection with time-alignment sections 700 and 800, respectively. In common-mode task 504, control of time-alignment section 700 adjusts the delay imposed in delayed-complex-forward-data stream 266, but in differential-mode task 506, control of time-alignment section 800 adjusts the delay imposed in one of the I and Q legs of complex-return-data-stream 262 relative to the other.

Subprocess 600 performs a task 602 to couple correlation engine (CE) 280 to the "ideal" delayed-complex-forward-data stream 266 and to complex-return-data-stream 262 by appropriate selection at multiplexers 270 and 278.

Next, a task 604 sets correlation convergence criteria. The convergence criteria determine how many samples correlation engine 280 needs to correlate and integrate before it can be deemed as having converged upon a correlation solution. As discussed above, a greater number of samples processed leads to a greater increase in effective resolution, or reduction in error level, in the return-data stream. An increase in algorithmic processing time is thus transformed into a reduced effective-error level for the return-data stream. Through task 604, the rate of convergence is controlled to achieve a predetermined effective return-error level less than the error level associated with the return-data stream. In one example, approximately $10^6$ samples may be processed to achieve a signal-to-noise improvement of around 60 dB. Of course, subprocess 600 is not required to set different convergence criteria in different situations, but correlation engine 280 may be hardware-programmed to use the same criteria for all situations. In this situation, task 604 is performed by correlation engine 280 and not controller 286.

After task 604, subprocess 600 performs a query task 606. Task 606 determines when correlation engine 280 has converged upon a correlation solution. During task 606, correlation engine 280 processes a multiplicity of samples. Correlation is performed between the return-data stream and the delayed-forward-data stream as delayed through a programmable delay element that has been programmed to impose some duration of delay. That programmable delay element was initialized to a mid-range value.

When that correlation solution occurs, an initializing task 608 then makes an initializing estimate of a large step and positive offset to use in an upcoming binary-search algorithm. The step size of "large" refers to how different the programmed duration for an upcoming iteration of the binary-search algorithm will be from delay imposed in the previous correlation. The offset of "positive" is an arbitrary value that indicates that the upcoming iteration delay will be greater than the previous. After task 608, a task 610 adjusts the programmable time-alignment hardware (either section 700 or section 800) to reflect the current step size and offset direction.

Figure 7:
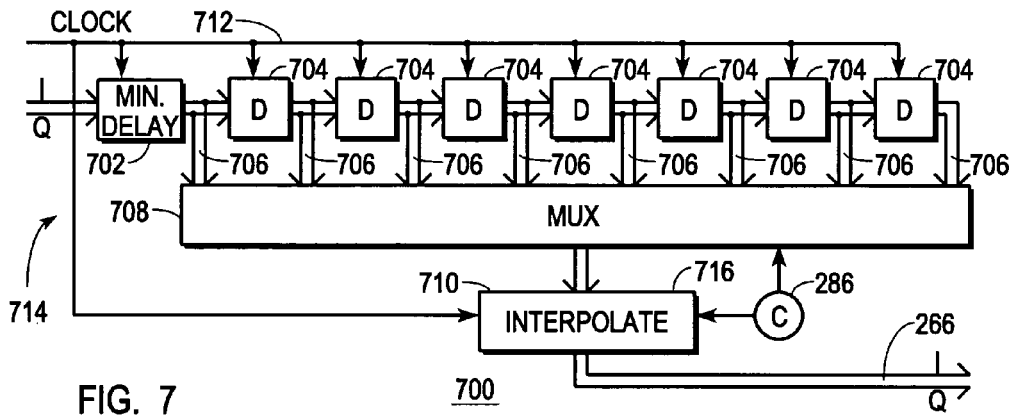
FIG. 7 shows a block diagram of a common-mode-time-align section suitable for use in the linear-and-nonlinear-predistortion section of the transmitter depicted in FIG. 1.

FIG. 7 shows a block diagram of one embodiment of common-mode-time-alignment section 700. This embodiment is desirable because it achieves accurate and precise results using a relatively simple hardware implementation. But while time-alignment section 700 provides suitable results for the purposes of linear-and-nonlinear-predistortion circuit 200, those skilled in the art will be able to devise alternate embodiments that will also work. Time-alignment section 700 includes a minimum-delay element 702 that receives the complex-data stream from multiplexer 222. Minimum-delay element 702 is a non-programmable element that inserts an integral number of clock-cycle delays roughly equivalent to the minimum delay that is expected to be imposed by the combination of: combining circuit 200, time-alignment section 800, linear predistorter 244, analog components 120, feedback section 248, attenuator 256, and equalizer 260. A clocked, complex-tapped-delay line 704 is driven by minimum-delay element 702. Each leg of the complex signal is equivalently delayed in delay line 704. While FIG. 7 depicts eight taps 706, those skilled in the art will appreciate that any number of taps 706 may be provided. Taps 706 couple to data inputs of a multiplexer 708, which has an output that routes a selected tap to an input of a complex interpolator 710. Interpolator 710 may be implemented using a Farrow or other architecture and delays both legs of the complex signal by equal amounts. An output of interpolator 710 provides delayed-complex-forward-data stream 266. Controller (C) 286 provides control inputs to multiplexer 708 and interpolator 710. A clock signal 712 is also provided to minimum-delay element 702, delay line 704, and interpolator 710. Clock 712 is desirably synchronized to the data rate of the forward-data and return-data streams.

When task 610 is being used for common-mode-time-alignment section 700 (i.e., during task 504), time-alignment section 700 may be adjusted by providing appropriate controlling inputs to multiplexer 708 and interpolator 710. An integral section 714 includes delay line 704 and multiplexer 708 and serves to provide an integral number of cycles of clock 712 delay, as specified by control data provided by controller 286. A fractional section 716 includes interpolator 710 and serves to provide a fraction of a cycle of a clock 712 delay. An integral portion of any delay to be programmed into time-alignment section 700 is accomplished by controlling multiplexer 708, and a fractional portion of the delay is accomplished by controlling interpolator 710.

Figure 8:
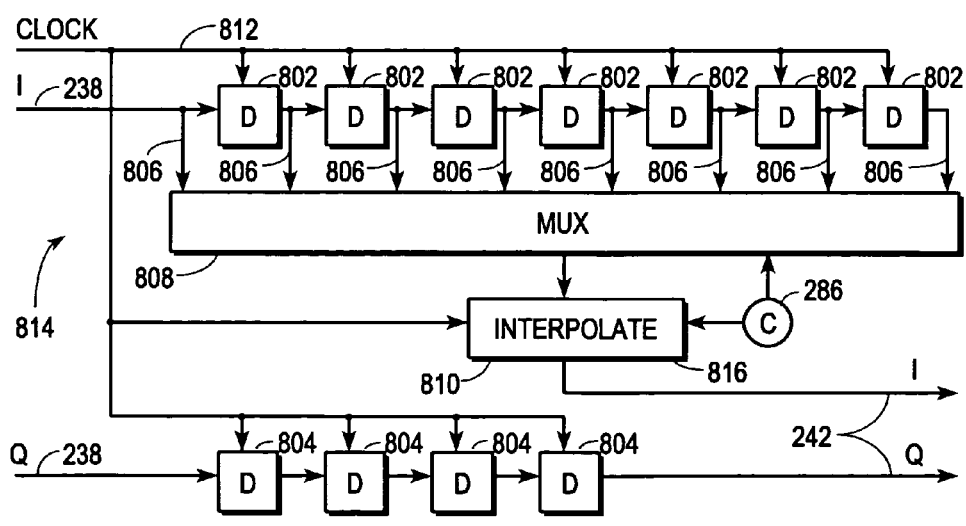
FIG. 8 shows a block diagram of a differential-mode-time-align section suitable for use in the linear-and-nonlinear-predistortion section of the transmitter depicted in FIG. 1.

FIG. 8 shows a block diagram of one embodiment of differential-mode-time-alignment section 800. This embodiment is desirable because it achieves accurate and precise results using a relatively simple hardware implementation. But while time-alignment section 800 provides suitable results for the purposes of linear-and-nonlinear-predistortion circuit 200, those skilled in the art will be able to devise alternate embodiments that will also work. Differential-mode-time-alignment section 800 is in many ways similar to common-mode-time-alignment section 700, but has a different effect. One leg, shown as the I leg in FIG. 8, of complex-forward-data stream 238 is routed to a clocked, complex-tapped-delay line 802. The other leg, shown as the Q leg in FIG. 8, is routed to a fixed-delay element 804. Delay element 804 is configured to implement about ½ of the delay of delay line 802. While FIG. 8 depicts delay line 802 as having eight taps 806, those skilled in the art will appreciate that any number of taps 806 may be provided. Taps 806 couple to data inputs of a multiplexer 808, which has an output that routes a selected tap to an input of an interpolator 810. Interpolator 810 may be implemented using a Farrow or other architecture. An output of interpolator 810 provides the I leg of complex-forward-data stream 242 while an output of delay element 804 provides the Q leg of data stream 242. Controller (C) 286 provides control inputs to multiplexer 808 and interpolator 810. A clock signal 812 is also provided to delay line 802, delay element 804, and interpolator 810. Clock 812 is desirably synchronized to the data rate of the forward-data and return-data streams.

When task 610 is being used for differential-mode-time-alignment section 800 (i.e., during task 506), time-alignment section 800 may be adjusted by providing appropriate controlling inputs to multiplexer 808 and interpolator 810. An integral section 814 includes delay line 802 and multiplexer 808 and serves to provide an integral number of cycles of clock 812 delay, as specified by control data provided by controller 286. A fractional section 816 includes interpolator 810 and serves to provide a fraction of a cycle of a clock 812 delay. An integral portion of any delay to be programmed into time-alignment section 800 is accomplished by controlling multiplexer 808, and a fractional portion of the delay is accomplished by controlling interpolator 810.

Referring back to FIG. 6, after task 610 adjusts time-alignment hardware to reflect a new delay duration based upon the old delay duration and the current step size and polarity, a query task 612 is performed. During task 612, correlation engine 280 performs its correlation and integration operation until the correlation criteria have been met. When task 612 determines that the correlation criteria have been met, a query task 614 determines whether the current correlation results are greater than the maximum correlation recorded so far during this invocation of process 600. If the current correlation results are not greater than prior correlations, then a task 616 makes the step estimate the same size as before but changes the offset polarity, and program control proceeds to a query task 618. If the current correlation results are greater than the maximum correlation, a task 620 estimates a step size reduced from the previous step size, and typically 0.5 to 1.0 times the previous step size, and also estimates the same polarity offset. Then, program control proceeds to task 618.

Task 618 determines whether the time-alignment-estimation-and-convergence algorithm has now converged on either a common-mode-delay value or differential-mode-delay value that maximizes the correlation between the forward-data and return-data streams. Convergence may be determined by monitoring the current step size and concluding that convergence has been reached when the current step size is less than the resolution of interpolator 710 or 810. When task 618 determines that delay convergence has not yet occurred, program control loops back to task 610. At task 610 the previous estimate of delay is altered in accordance with the current step size and offset polarity, and the correlation process repeated.

When task 618 determines that delay convergence has occurred, subprocess 600 is complete. At this point, delayed-complex-forward-data stream 266 has been temporally aligned with complex-return-data stream 262. And, linear-compensation process 500 may proceed to perform another alignment-process which is a prerequisite in the preferred embodiment to actual linear compensation.

Referring back to FIG. 5, after the invocation of subprocess 600 two times, once for common-mode time alignment and once for differential-mode time alignment in tasks 504 and 506 respectively, a subprocess 900 is performed to implement an estimation-and-convergence algorithm in which aligned-complex-forward-data stream 272 is rotated in phase relative to delayed-complex-forward-data stream 266 by phase rotator 1000.

Figure 9:
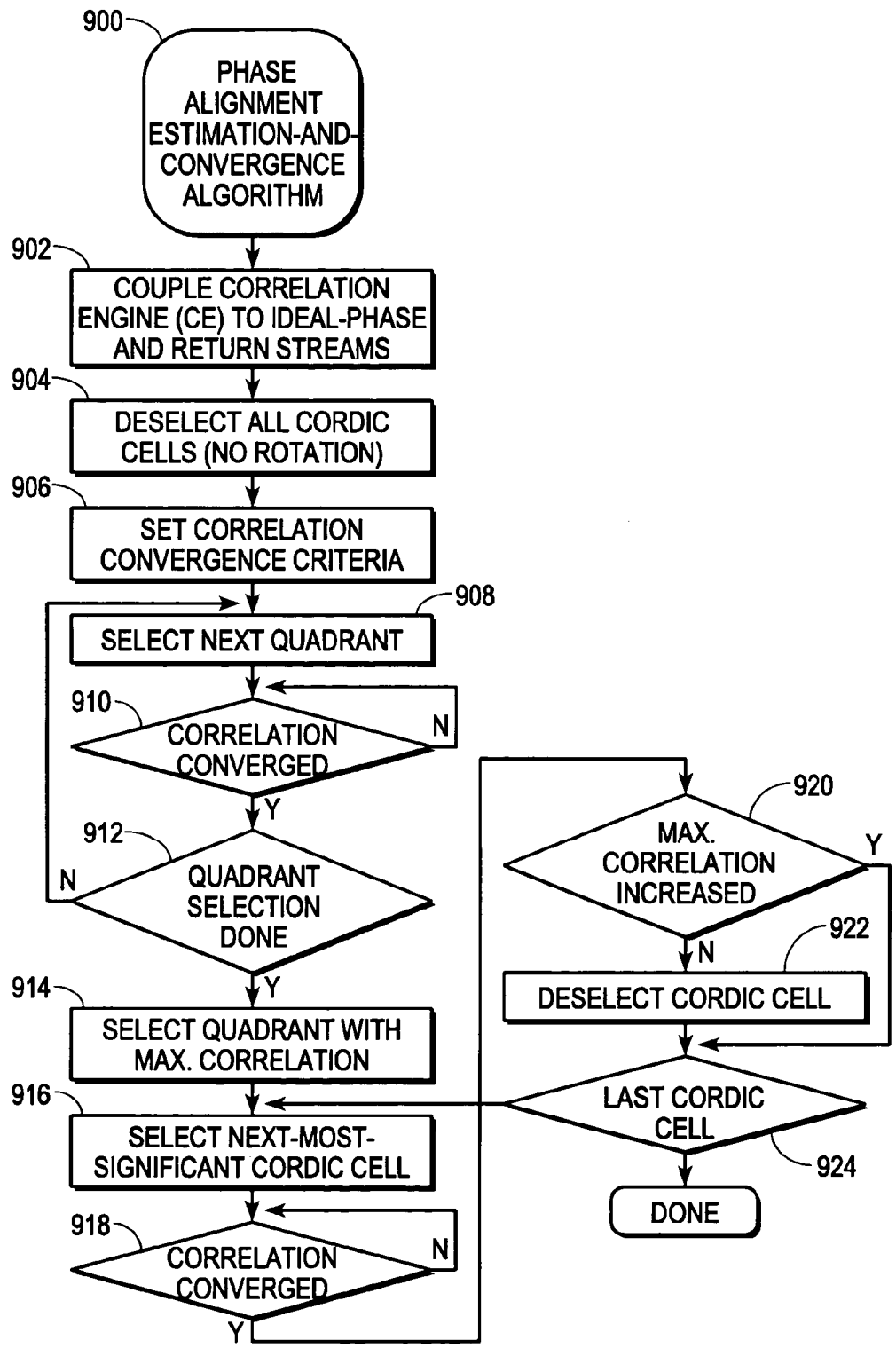
FIG. 9 shows a flowchart of a subprocess of the subprocesses depicted in FIGS. 5 and 14, wherein this subprocess implements a common-mode-phase-alignment-estimation-and-convergence algorithm.

FIG. 9 shows a flowchart of subprocess 900. Subprocess 900 includes a task 902 that controls multiplexer 270 so that correlation engine 280 is coupled to perform correlation between the "ideal" aligned-complex-forward-data stream 272 and the complex-return-data stream 262. Then, a task 904 deselects CORDIC cells. Task 904 is directed to a specific hardware implementation for phase rotator 1000 that is implemented in the preferred embodiment.

Figure 10:
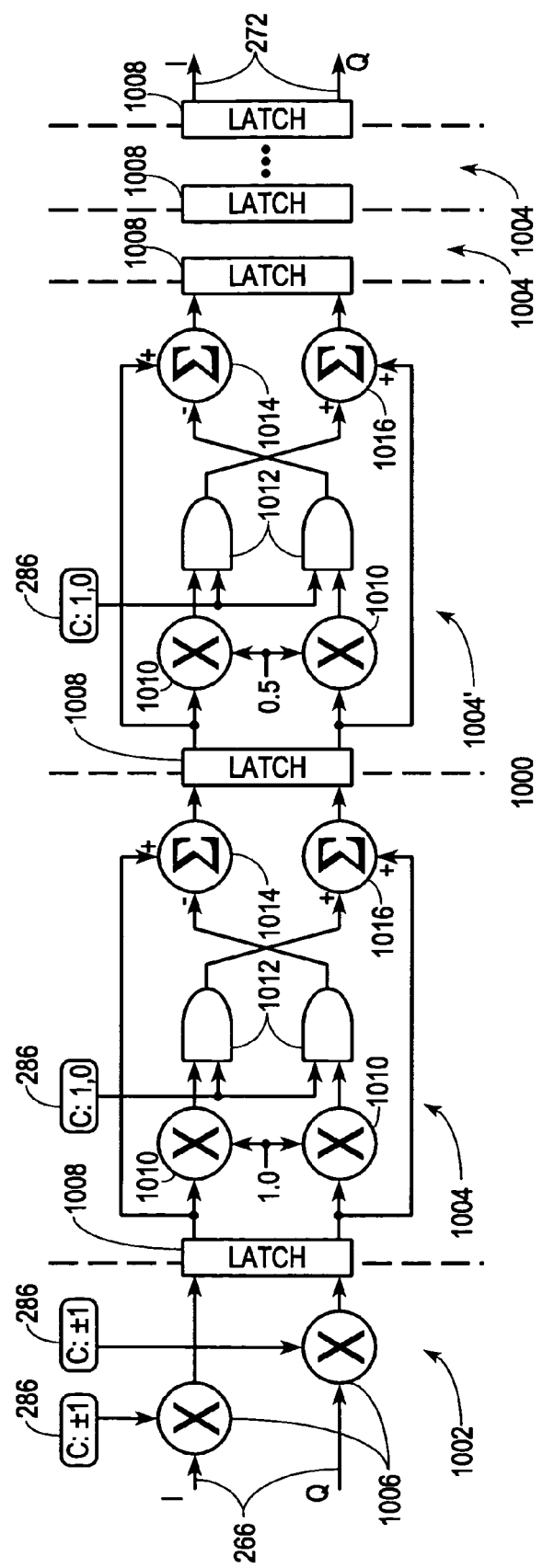
FIG. 10 shows a block diagram of a phase-rotate section suitable for use in the linear-and-nonlinear-predistortion section of the transmitter depicted in FIG. 1.

FIG. 10 shows a block diagram of one embodiment of phase-rotate section 1000. This embodiment is desirable because it achieves accurate and precise results using a relatively simple hardware implementation. But while phase-rotate section 1000 provides suitable results for the purposes of linear-and-nonlinear-predistortion circuit 200, those skilled in the art will be able to devise alternate embodiments that will also work. Phase-rotate section 1000 includes a quadrant selection cell 1002, followed by a cascaded series of CORDIC cells 1004. FIG. 10 depicts only two of CORDIC cells 1004 in detail, labeled cells 1004 and 1004'. But the remaining cells 1004 should have a structure similar to cell 1004'. Any number of CORDIC cells 1004 may be included, with the preferred embodiment having between 6 and 16 cells 1004. If ten CORDIC cells 1004 are included, then precision may be provided to within about 0.112 degrees.

Delayed-complex-forward-data stream 266 is received at quadrant-selection cell 1002. Each leg of the complex-data stream is received at its own selective inversion circuit 1006, depicted in FIG. 10 as a multiplier. Selective inversion circuits 1006 are independently controlled by controller 286 to either invert, or let the data stream pass unaltered. FIG. 10 depicts each cell 1002 and 1004 as terminating at a latch 1008. By controlling circuits 1006 to exhibit all combinations of inversion and passing, four possible quadrants are estimated, wherein cell 1002 can shift the incoming-data stream 266 either 0°, 90°, 180°, or 270° degrees.

Within each CORDIC cell 1004, the I and Q legs of the cell's incoming-complex-data stream are respectively routed to shifters 1010. FIG. 10 depicts shifters 1010 as being multiplication circuits because shifters 1010 perform mathematical multiplication by the inverse of a power of two. For the first CORDIC cell 1004, shifters 1010 may be omitted because they shift the incoming data to the right by zero bits and perform a multiplication by one. In the second cell 1004' and subsequent cells 1004, shifters 1010 shift the incoming data to the right by one additional bit from the shift of the previous cell. Thus, FIG. 10 depicts shifters 1010 as multiplying by 0.5 in cell 1004'. The third CORDIC cell 1004 would effectively multiply by 0.25, and so on. Those skilled in the art will appreciate that shifters 1010 need not be implemented using physical components but may be implemented merely through interconnections.

Within each CORDIC cell 1004, outputs from shifters 1010 are routed to inputs of a selective-enablement circuit 1012, depicted as a couple of AND gates, with one gate for each leg of the complex signal. The other input of each AND gate is controlled by controller 286. Thus, controller 286 either enables the output from shifters 1010 to pass unimpeded, or forces a zero value.

In the I leg of each CORDIC cell 1004, a subtractor 1014 subtracts the output of the selective-enablement circuit 1012 in the Q leg from the I leg of the incoming-data stream. In the Q leg of each CORDIC cell 1004, an adder 1016 adds the output of the selective-enablement circuit 1012 in the I leg with the Q leg of the incoming-data stream. From subtractor 1014 and adder 1016, the I and Q legs exit the CORDIC cell 1004 through latch 1008.

Each CORDIC cell 1004 rotates its incoming complex signal by progressively smaller angles, as indicated in the following example:

TABLE I

10 CORDIC Cell Phase Rotator

| mult. | 1.0 | 0.5 | 0.25 | 0.125 | 0.063 | 0.031 | 0.016 | 0.008 | 0.004 | 0.002 |
|---|---|---|---|---|---|---|---|---|---|---|
| angle (degrees) | 45.0 | 26.6 | 14.0 | 7.125 | 3.576 | 1.790 | 0.895 | 0.448 | 0.224 | 0.112 |

Each cell's rotation is slightly more than ½ of the previous cells' rotation. Thus, by selectively combining the rotation of various CORDIC cells 1004, any angle within the range of 0°–90° may be achieved, to a resolution determined by the number of CORDIC cells included in phase rotator 1000.

Referring to FIGS. 9 and 10, task 904 disables selective-enablement circuits 1012 in each cell 1004 so that in no cell 1004 is any portion of one leg's signal cross-coupled to the other leg. Consequently, CORDIC cells 1004 do not rotate as a result of task 904. Following task 904, a task 906 sets the convergence criteria. As discussed above in connection with task 604, setting the convergence criteria controls the rate of correlation convergence to achieve a predetermined effective-error level using the low-resolution return-data stream. Through task 906, increased algorithmic processing time is transformed into reduced effective-error levels for the return-data stream.

After task 906, a task 908 selects another quadrant by adjusting the control inputs at selective inverters 1006. The current amount of rotation imparted by phase-rotation section 1000 represents an estimate of the phase rotation needed to bring aligned-complex-forward-data stream 272 into phase alignment with complex-return-data stream 262.

Following task 908, correlation engine 280 integrates the correlation between aligned-complex-forward-data stream 272 and complex-return-data stream 262 at the current phase rotation estimate. A query task 910 determines whether the convergence criteria set above in task 906 have been met. Program control remains at task 910 until the criteria are met. When the convergence criteria are met, a query task 912 determines whether all four quadrants have been selected yet. If fewer than four quadrants have been tried, the correlation results are saved and program control loops back to task 908 until all four quadrants have been tested.

While tasks 908, 910, and 912 depict one embodiment of quadrant evaluation, in an alternate embodiment one of the legs of the forward-data and reverse-data streams may be correlated with both legs of the other stream. Moreover, results from a prior correlation subprocess, such as subprocess 600 may be used. Then, quadrant selection may be made based on the relative magnitudes and polarities of the correlation results.

When all four quadrants have been tested or otherwise evaluated, a task 914 selects the quadrant that generated or should generate the maximum correlation from the four quadrants and so programs selective inverters 1006. Then, a task 916 selects the next-most-significant CORDIC cell 1004 by enabling that cell 1004. For the first iteration of task 916, the CORDIC cell 1004 that shifts by 45° is selected. At this point another estimate of the phase rotation needed to bring aligned-complex-forward-data stream 272 into phase alignment with complex-return-data stream 262 has been made, and correlation engine 280 performs its correlation and integration task.

Following task 918, a query task 916 determines whether the convergence criteria set above in task 906 have been met. When the convergence criteria are met, a query task 920 determines whether the maximum correlation recorded so far for this invocation of subprocess 900 has been increased by the most recent estimate. If no increase is detected, then a task 922 deselects the current CORDIC cell 1004. Following task 922 and when task 920 detects an increase in maximum correlation, a task 924 determines whether the last, least-significant CORDIC cell 1004 has been selected. So long as less-significant CORDIC cells 1004 remain to be tested, program control loops back to task 916.

When task 924 determines that the last CORDIC cell 1004 has been evaluated, subprocess 900 is complete. At this point subprocess 900 has tested all CORDIC cells 1004 and selected that combination of cells 1004 that yielded the phase-rotation estimate achieving the maximum correlation, as determined by correlation engine 280. This subprocess brings aligned-complex-forward-data stream 272 into phase alignment with complex-return-data stream 262, to a degree of precision determined by the convergence criteria used by correlation engine 280 and the number of CORDIC cells 1004 included in phase-rotate section 1000.

Referring back to FIG. 5, after the completion of subprocess 900, a task 508 optimizes the gain adjustment provided by adjustable attenuators 302 and 256. Accordingly a suitable optimization algorithm is implemented in task 508 to increase and/or decrease programmable attenuation provided in coarse-adjustment and fine-adjustment attenuators 302 and 256, respectively. The optimization algorithm may desirably make attenuation adjustments in order to maximize the correlation results, as determined by correlation engine 280, between forward-data stream 272 and return-data stream 262. The optimization algorithm may use techniques similar to those discussed above in connection with FIGS. 6–10, or other techniques may be applied.

Following task 508, linear-and-nonlinear-predistortion circuit 200 is now sufficiently trained so that it is prepared to more directly address the problem of compensation for linear distortion introduced by analog components 120. At this point the "ideal" forward-data stream and the reverse-data stream are in time and phase alignment with each other at complex combining circuit 274. Accordingly, error stream 276 now describes distortion introduced by analog components 120. But as described above, error stream 276 is formed, at least in part, from the return-data stream and exhibits a high error level and low resolution. A subprocess 1100 is now invoked to perform an equalization-estimation-and-convergence algorithm for forward equalizer 246.

Figure 11:
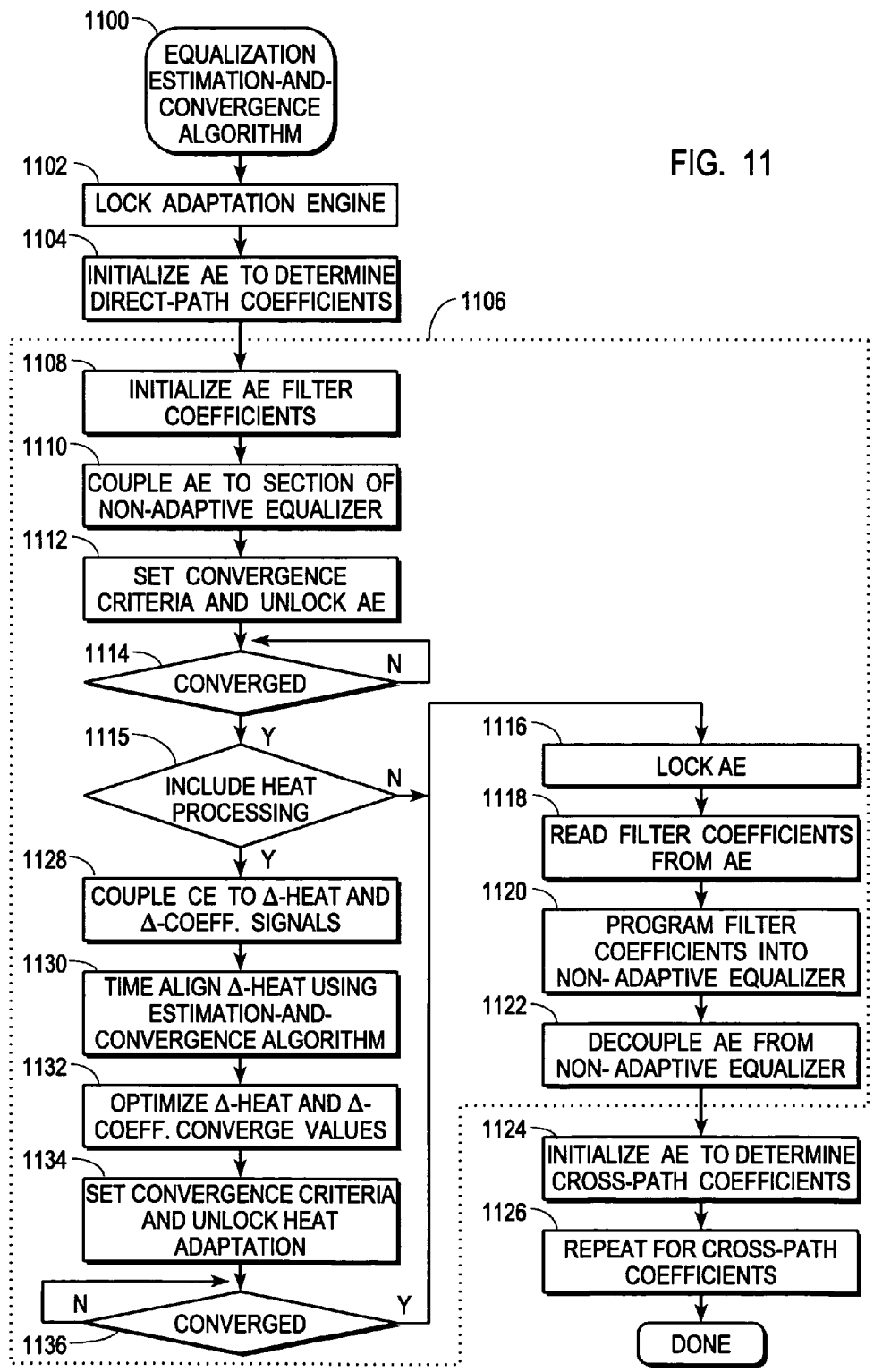
FIG. 11 shows a flowchart of a subprocess of the subprocesses depicted in FIGS. 5, 14 and 15, wherein this subprocess implements an equalization-estimation-and-convergence algorithm.
Figure 12:
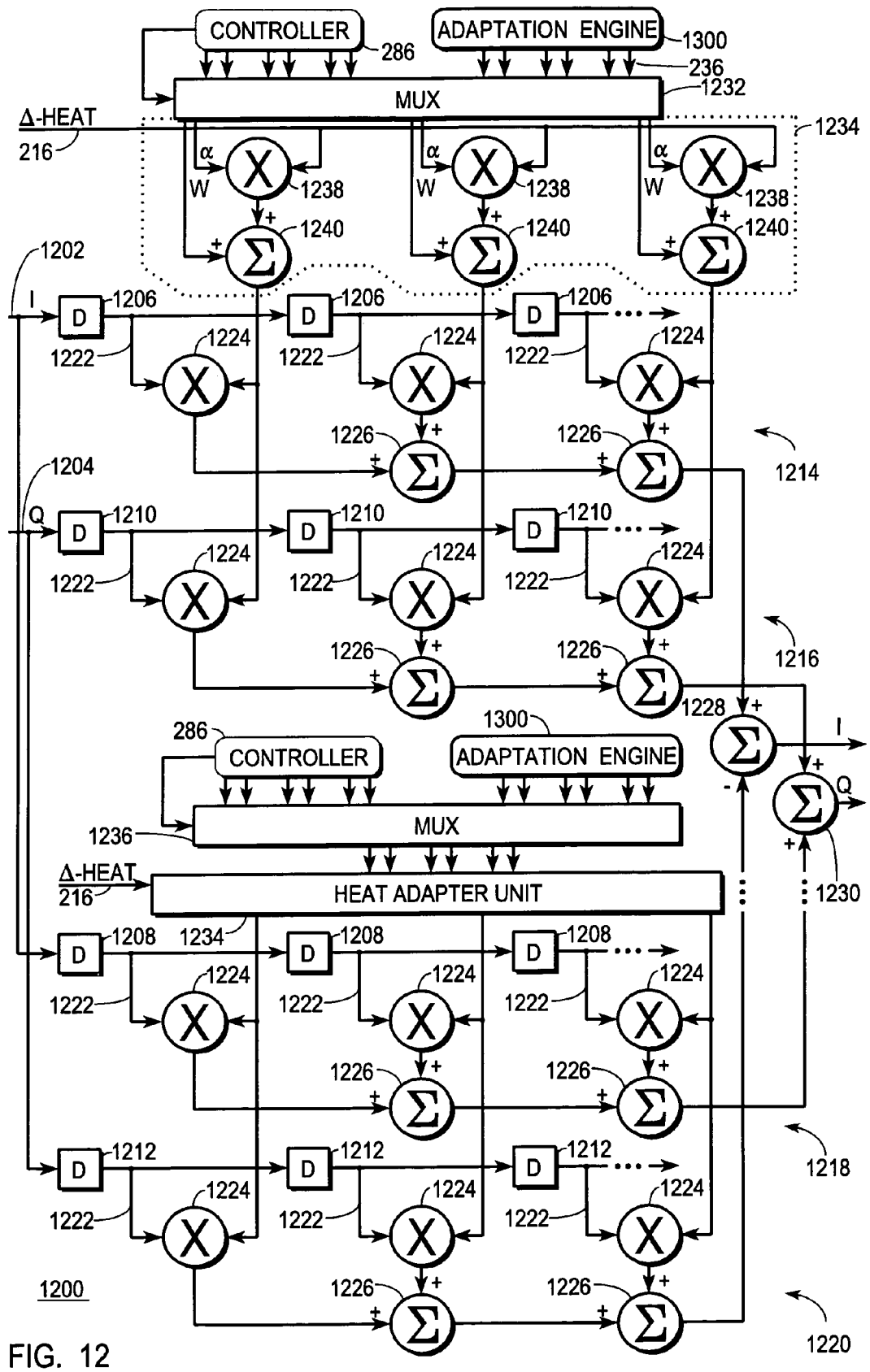
FIG. 12 shows a block diagram of a representative equalizer suitable for use in several sections of the linear-and-nonlinear-predistortion section of the transmitter depicted in FIG. 1.
Figure 13:
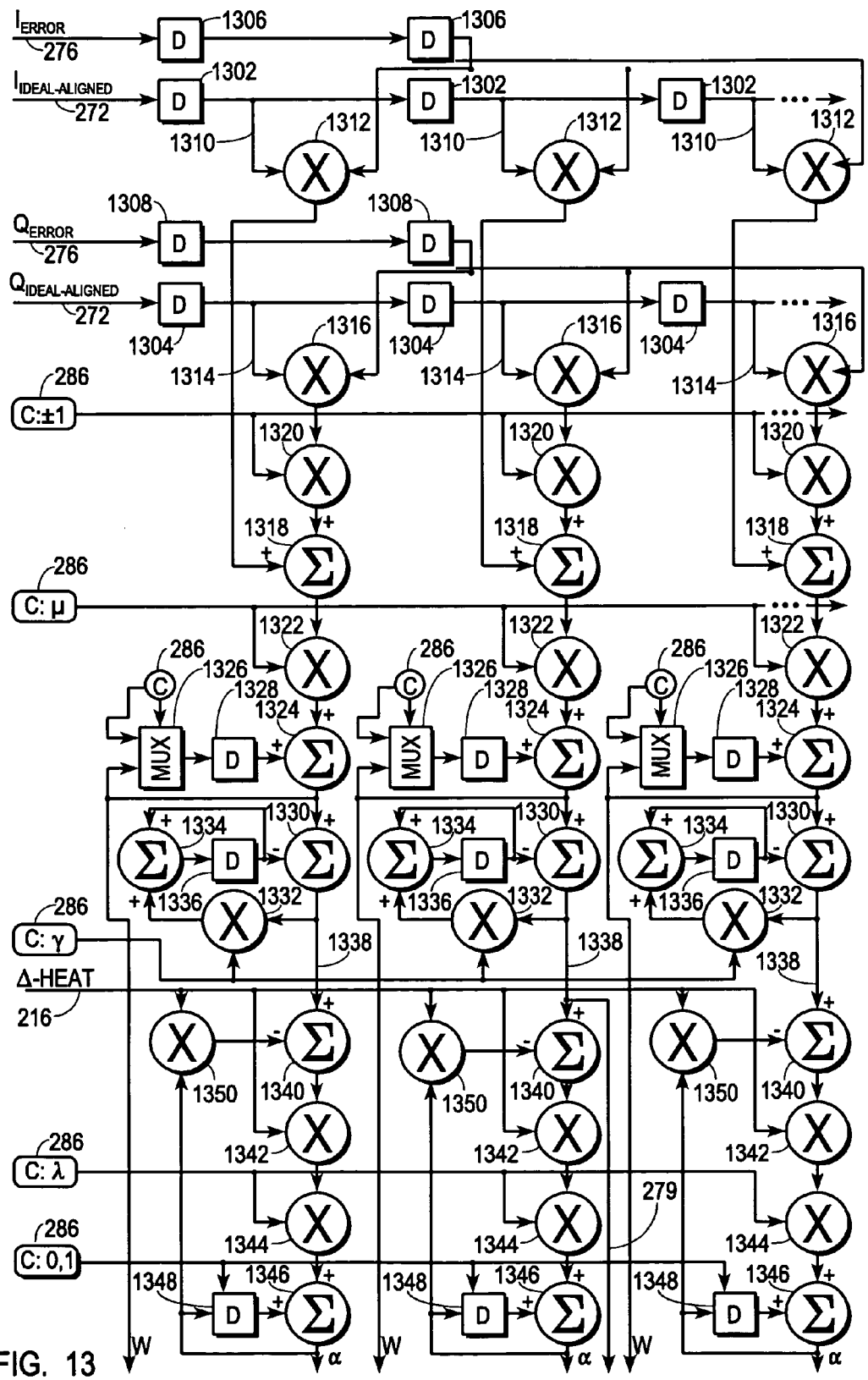
FIG. 13 shows a block diagram of an adaptation engine section suitable for use in the linear-and-nonlinear-predistortion section of the transmitter depicted in FIG. 1.

FIG. 11 shows a flowchart of subprocess 1100. Subprocess 1100 is configured to operate with a particular embodiment of a non-adaptive equalizer 1200 and a particular embodiment of an adaptation engine 1300. FIG. 12 shows a block diagram of a representative non-adaptive equalizer 1200 suitable for use in several sections of the linear-and-nonlinear-predistortion circuit 200 and for use in connection with subprocess 1100. Forward equalizer 246 may be configured similarly to non-adaptive equalizer 1200 but is likely to have more taps. Likewise, FIG. 13 shows a block diagram of an adaptation engine 1300 suitable for use in connection with the non-adaptive equalizer 1200 depicted in FIG. 12 and with linear-and-nonlinear-predistortion circuit 200. But those skilled in the art will understand that other embodiments of non-adaptive equalizer 1200, adaptation engine 1300, and subprocess 1100 may be devised to achieve many of the goals of the present invention.

Referring to FIG. 12, non-adaptive equalizer 1200 is a complex equalizer depicted for convenience as having only three taps, but those skilled in the art will understand that the number of taps may be easily expanded or shrunk as needed for a particular application. The I and Q legs of the complex-input-data stream are applied at nodes 1202 and 1204, respectively. Equalizer 1200, or the equivalent, may be used in a variety of locations in linear-and-nonlinear-predistortion circuit 200, such as for equalizers 226, 246, and/or 260. Consequently, the precise identity of the complex-input-data stream will depend upon its location of use.

I-node 1202 couples to and drives clocked-tapped-delay lines 1206 and 1208, and Q-node 1204 couples to and drives clocked-tapped-delay lines 1210 and 1212. Delay line 1206 drives an in-phase, direct path 1214 of equalizer 1200; delay line 1210 drives a quadrature, direct path 1216 of equalizer 1200; delay line 1208 drives an in-phase-to-quadrature, crossover path 1218 of equalizer 1200; and, delay line 1212 drives a quadrature-to-in-phase, crossover path 1220 of equalizer 1200.

Each tap 1222 from each delay lines 1206, 1208, 1210, and 1212 drives a first input of its own multiplier 1224, and outputs of multipliers 1224 drive adders 1226. An output from in-phase path 1214 is provided by the sum of all multiplier 1224 outputs in that path to a positive input of a subtractor 1228, and an output from quadrature-to-in-phase path 1220 is provided by the sum of all multiplier 1224 outputs in that path to a negative input of subtractor 1228. An output from quadrature path 1216 is provided by the sum of all multiplier 1224 outputs in that path to a first input of an adder 1230, and an output from in-phase-to-quadrature path 1218 is provided by the sum of all multiplier 1224 outputs in that path to a second input of adder 1230. An output of subtractor 1228 provides the I leg of the complex-output-data stream while the output of adder 1230 provides the Q leg of the complex-output-data stream.

Each tap 1222 of the in-phase and quadrature direct paths 1214 and 1216 has the same filter coefficient, provided by a multiplexer 1232 through an optional heat-adapter unit 1234, which has one output for each tap 1222. FIG. 12 shows two heat-adapter units 1234, with details provided for only one of the two heat-adapter units 1234. If heat-adapter units 1234 are omitted, then each tap's filter coefficient is provided directly from multiplexer 1232. That filter-coefficient output couples to a second input of the corresponding two multipliers 1224 in direct paths 1214 and 1216. Likewise, each tap 1222 of the crossover paths 1218 and 1220 has the same filter coefficient, provided by a multiplexer 1236 through an optional heat-adapter unit 1234, which has one output for each tap 1224. That filter-coefficient output couples to a second input of the corresponding two multipliers 1224 for crossover paths 1218 and 1220.

Multiplexers 1232 and 1236 receive filter coefficients either from adaptation engine 1300 at feature 236 or from controller 286. When heat-adapter units 1234 are included, a heat-sensitivity coefficient is also received either from adaptation engine 1300 or controller 286. Controller 286 also controls selection inputs of multiplexers 1232 and 1234 to couple and decouple equalizer 1200 from adaptation engine 1300 by routing filter coefficients and heat-sensitivity coefficients either from controller 286 or from adaptation engine 1300. When filter coefficients and optional heat-sensitivity coefficients are supplied from controller 286, equalizer 1200 operates in a non-adaptive mode. In the non-adaptive mode a set of direct-filter coefficients and direct-heat-sensitivity coefficients are programmed into the direct paths 1214 and 1216 by controller 286, and a set of crossover-filter coefficients and crossover-heat-sensitivity coefficients are programmed into the crossover paths 1218 and 1220 by controller 286. Neither set of filter coefficients changes unless controller 286 alters the programming. But the filter coefficients may optionally be adjusted within heat-adapter units 1234 in response to delta-heat signal 216. In the preferred embodiment, optional heat-adapter units 1234 are included with non-adaptive equalizers 226, but may be included with other equalizers or omitted from all equalizers in other applications.

Each heat-adapter unit 1234 includes a multiplier 1238 for each tap and an adder 1240 for each tap. Delta-heat signal 216 couples to first inputs of each of multipliers 1238. For each tap, multiplexer 1232 or 1238 provides a heat-sensitivity coefficient "α" to second inputs of the tap's multiplier 1238. Respective outputs of multipliers 1238 couple to corresponding first inputs of adders 1240. And, for each tap, multiplexer 1232 or 1238 provides a filter coefficient "w" to second inputs of adders 1240. The outputs of adders 1240 provide the filter-coefficient outputs of heat-adapter units 1234. Thus, filter coefficients are offset, either positively or negatively, in response to delta-heat signal 216 as weighted by heat-sensitivity coefficients.

When filter coefficients and optional heat-sensitivity coefficients are supplied from adaptation engine 1300, equalizer 1200 operates in an adaptive mode. In the adaptive mode at least one of the direct and crossover sets of filter coefficients and heat-sensitivity coefficients are supplied by adaptation engine 1300, and these sets of filter coefficients and heat-sensitivity coefficients can continuously change so long as equalizer 1200 remains in its adaptive mode.

Referring to FIG. 13, in one embodiment adaptation engine 1300 is configured to accommodate a partial complex equalizer to reduce the number of components of linear-and-nonlinear-predistortion circuit 200. In particular, when adaptation engine 1300 is coupled to a non-adaptive equalizer 1200, it is coupled to either the direct paths 1214 and 1216 or to the crossover paths 1218 and 1220, but not both. For consistency with the three-tap complex equalizer 1200 depicted in FIG. 12, FIG. 13 depicts a three-tap arrangement. But those skilled in the art will understand that the number of taps may be easily expanded or shrunk as needed for a particular application.

The I and Q legs of the "ideal" aligned-complex-forward-data stream 272 are respectively supplied to clocked-tapped-delay lines 1302 and 1304, with each delay line being depicted as having three taps for convenience. The I and Q legs of error stream 276 are respectively supplied to delay elements 1306 and 1308, where delay elements 1306 and 1308 are each configured to delay the error stream 276 to the middle of tapped-delay lines 1302 and 1304. Taps 1310 from the in-phase delay-line 1302 respectively couple to first inputs of corresponding in-phase multipliers 1312, and taps 1314 from the quadrature delay-line 1304 respectively couple to first inputs of corresponding quadrature-phase multipliers 1316. Outputs from in-phase multipliers 1312 respectively couple to first inputs of corresponding adders 1318, and outputs from quadrature multipliers 1316 respectively couple to second inputs of the corresponding adders 1318 through selective inversion elements 1320.

Selective inversion elements 1320 are depicted in FIG. 13 as being multipliers, with one of the multiplier inputs being controlled by controller 286. Controller 286 causes inversion of the weighted-quadrature signals output by quadrature multipliers 1316 when adaptation engine 1300 is operated in the mode where it is coupled to crossover paths 1218 and 1220 of non-adaptive equalizer 1200, but no inversion of the weighted-quadrature signals output by quadrature multipliers 1316 when adaptation engine 1300 is operated in the mode where it is coupled to direct paths 1214 and 1216. Those skilled in the art will appreciate that multipliers need not be used to implement selective inversion elements 1320. Likewise, those skilled in the art will appreciate that complexity may be reduced in adaptation engine 1300 by quantizing error signal 276, ideal-aligned signal 272, or both to a single bit or to a −/0/+ triplet. In this alternative, the above discussed multipliers may be replaced by simpler circuits.

Respective outputs of adders 1318 present noisy signals because they are based on the return-data stream. These outputs couple to first inputs of corresponding multipliers 1322, with the second inputs of multipliers 1322 all being coupled to controller 286. Controller 286 provides a convergence factor "μ" which determines how much filter coefficients are allowed to change from clock-cycle to clock-cycle. In the preferred embodiment, a small value is used for μ to prevent any single instance or even moderate-sized groups of instances of the noisy signals outputs by adders 1318 from exerting any great influence by allowing a significant amount of change.

Respective outputs of multipliers 1322 couple to first inputs of corresponding adders 1324. Respective outputs of each adder 1324 couple through first data inputs of corresponding multiplexers (MUX) 1326 to corresponding one-cycle delay elements 1328. Second data inputs and selection control inputs of multiplexers 1326 are provided by controller 286. Delay elements 1328 may be initialized to predetermined filter coefficients by controller 286. But in normal adaptation-operating conditions, each adder 1324 adds a change-in-filter-coefficient value to the previous coefficient value that has been retained in the corresponding delay element 1328. In addition, for each tap, the output of adder 1324 provides filter coefficient "w" that is output by adaptation engine 1300 at feature 236. Filter coefficients "w" are provided to equalizers 1200 when operating in their adaptive modes and are also readable by controller 286.

Subsequent processing of filter coefficients is directed to the heat-related memory effect. In particular, the filter coefficients "w" output from respective adders 1324 are routed to corresponding IIR-filter circuits. The filter circuits each include a subtraction circuit 1330, a multiplier 1332, an adder 1334, and a one-cycle delay element 1336. Outputs from respective adders 1324 couple to positive inputs of corresponding subtraction circuits 1330. Respective outputs of corresponding subtraction circuits 1330 provide the filter output and couple to first inputs of sensitivity multipliers 1332. Second inputs of each of sensitivity multipliers 1332 are adapted to receive a coefficient-sensitivity factor γ supplied by controller 286. Outputs of respective multipliers 1332 provided to first inputs of corresponding adders 1334, and outputs of respective adders 1334 are delayed for one clock cycle through corresponding delay elements 1336. Respective outputs of delay elements 1336 are routed to second inputs of the corresponding adders 1334 and to negative inputs of the corresponding subtraction circuits 1330.

An average-coefficient output in each filtering circuit is provided by adder 1334. This output represents a long-term average or filtered signal for the filter coefficient "w". Subtraction circuit 1330 determines the difference between the current instantaneous value for the filter coefficient "w" and the long-term average, as set forth in the previous clock cycle. Coefficient-sensitivity factor γ determines the sensitivity of the long-term average to the influence of instantaneous filter coefficients, with smaller values for γ making the average reflect a longer term and less sensitive to the filter coefficient from any one clock cycle. A delta-coefficient stream 1338 is provided by the output of subtraction circuit 1330. For the middle tap of adaptation engine 1300, delta-coefficient stream 1338 forms delta-coefficient signal 279 that is selectively routed toward correlation engine 280.

It is the change in filter coefficients determined in response to average filter coefficient values over a preceding duration that can correlate with changes in temperature when HPA 136 experiences the heat-related memory effect. Accordingly, subsequent adaptation processing implements an LMS estimation-and-convergence adaptation algorithm on delta-coefficient streams 1338. In particular, respective delta-coefficient streams 1338 are routed to positive inputs of corresponding subtraction circuits 1340. Outputs of respective subtraction circuits 1340 are routed to first inputs of corresponding multipliers 1342, and outputs of respective multipliers 1342 are routed to first inputs of corresponding convergence multipliers 1344. Outputs of respective convergence multipliers 1344 are routed to first inputs of corresponding adders 1346, and outputs of respective adders 1346 are routed back to second inputs of the same adders 1346 through corresponding one-cycle delay elements 1348, thereby forming integrators from adders 1346 and delay elements 1348. In addition, the outputs of respective adders 1346 are routed to first inputs of corresponding multipliers 1350, and outputs of respective multipliers 1350 are routed to negative inputs of corresponding adders 1340. Delta-heat signal 216 drives second inputs of all multipliers 1350 and all multipliers 1342. And second inputs of convergence multipliers 1344 are supplied with a convergence value λ from controller 286.

The outputs of adders 1346 provide heat-sensitivity coefficients α output from adaptation engine 1300 at feature 236. Heat-sensitivity coefficients α are provided to equalizers 1200 when operating in their adaptive modes and are also readable by controller 286. Over time, heat-sensitivity coefficients α converge to increasingly accurate estimates of the sensitivity of changes in filter coefficients "w" to the delta-heat signal 216. As discussed below in connection with FIG. 17, delta-heat signal 216 characterizes the change in heat in HPA 136. Thus, heat-sensitivity coefficients α are used with the heat signal and filter coefficients in heat-adapter units 1234 to remove correlation that may exist between changes in heat in HPA 136 and changes in equalizer filter coefficients. In other words, heat-sensitivity coefficients α are determined which, when multiplied by delta-heat signal 216, cause the heat signal to become maximally correlated with the corresponding delta-coefficient signals 1338.

FIG. 13 depicts all one-cycle delay elements 1348 as having a clear input driven by an output from controller 286. This input allows controller 286 to initialize delay elements 1348 to a zero condition and to disable heat processing.

In one alternative embodiment of adaptation engine 1300, integrate-and-dump operations (not shown) may be performed on delta-heat signal 216 and delta-coefficient signals 1338 to slow their data rates. This is permitted because heat changes take place on a slower time scale than the symbol-by-symbol basis at which data is processed through transmitter 100. By slowing the data rates at this point, power may be conserved downstream of delta-coefficient signals 1338.

Referring back to FIG. 11, subprocess 1100 operates with an equalizer 1200 and with adaptation engine 1300 to implement an estimation-and-convergence algorithm that is tolerant of the low resolution and high-error level characteristic of error stream 276. When subprocess 1100 is being operated to address linear-distortion compensation and for initial stages of nonlinear-distortion compensation, heat processing is disabled through the operation of initialization task 502. Heat processing may be disabled by forcing one-cycle delay elements 1348 to exhibit zero values and by setting the convergence value λ to zero. This causes heat-adapter units 1234 to have no effect. But the disabling of heat processing is a moot point in connection with the equalizers 1200 that serve as forward or return equalizers 246 and 260 and that omit heat-adapter units 1234 in the preferred embodiment.

Subprocess 1100 performs a task 1102 to lock adaptation engine 1300. Adaptation engine 1300 may be locked by supplying a convergence factor of μ=0 to adaptation engine 1300. By locking adaptation engine 1300, filter coefficients "w" supplied through feature 236 cannot change. After task 1102, a task 1104 initializes the mode of adaptation engine (AE) 1300 to determine the filter coefficients for direct paths 1214 and 1216 of equalizer 1200. The choice of direct paths 1214 and 1216 over crossover paths 1218 and 1220 is arbitrary at this point. Adaptation engine 1300 may be initialized to direct-path-filter-coefficient adaptation by controlling selective inversion circuits 1320 so that they do not invert the weighted-quadrature signals they process. Following task 1104, subprocess 1100 begins a routine 1106 in which a set of filter coefficients is determined using an estimation-and-convergence algorithm for ½ of a complex equalizer 1200.

Of course, nothing requires adaptation engine 1300 to adapt only a portion of the paths of an equalizer 1200. If adaptation engine 1300 is configured to simultaneously adapt all paths of an equalizer 1200, then the circuitry of adaptation engine depicted in FIG. 13 is substantially doubled, but selective inversion circuits 1320 and task 1104 may be omitted. In this case, one-half of adaptation engine 1300 would perform addition in circuits 1318, and the other half of adaptation engine 1300 would perform subtraction in circuits 1318.

In particular, following task 1104, a task 1108 initializes adaptation engine (AE) filter coefficients. Task 1108 may initialize filter coefficients by forcing one-cycle delay elements 1328 to exhibit the filter coefficient set currently in use by the subject equalizer paths. But upon initialization and in other circumstances, one-cycle delay elements may be set to random values, to predetermined values, or not explicitly set at all.

After task 1108, a task 1110 couples adaptation engine (AE) 1300 to the subject ½ section of non-adaptive equalizer 1200. Coupling is performed by controlling multiplexer 1232 or 1236, as appropriate, to select filter coefficients from adaptation engine 1300 rather than from controller 286.

Next, a task 1112 sets the convergence criteria, in part, for the estimation-and-convergence algorithm and unlocks adaptation engine (AE) 1300. The partial setting of the convergence criteria and the unlocking of adaptation engine 1300 may both be accomplished by supplying adaptation engine 1300 with a positive value for the convergence variable μ. Desirably, this value is a fraction far less than one. The convergence criteria determine how many samples adaptation engine 1300 will process before it can be deemed as having converged upon a filter-coefficient-set solution. As discussed above, a greater number of samples processed leads to a greater increase in effective resolution, or reduction in error level, in the return-data stream. An increase in algorithmic processing time is thus transformed into a reduced effective-error level for the return-data stream. Through task 1112, the rate of convergence is controlled to achieve a predetermined effective return-error level less than the error level associated with the return-data stream. In one embodiment, the convergence variable μ is initially set to a somewhat higher value, but decreases over time. This approach allows rapid convergence to an approximate solution, followed by decreasing convergence rates which achieve smaller final tracking jitter.

Following task 1112, adaptation engine 1300 will implement a least mean square (LMS), estimation-and-convergence algorithm where filter-coefficient estimates are continuously altered to minimize the error signal. The LMS, estimation-and-convergence algorithm repetitively revises filter coefficients to minimize the error signal and to decorrelate the error signal from the forward-data stream. This operation also increases correlation between the forward-data and return-data streams. More particularly, filter coefficients are adjusted until the error signal resulting from either the HPA input signal 134 or the HPA output signal 117, depending upon the current state of multiplexer 250, becomes a substantially uncorrelated signal (e.g., is as close to white noise as possible).

At this point, a query task 1114 determines whether the filter coefficients being determined by adaptation engine 1300 may be deemed as having converged. Task 1114 works in conjunction with task 1112 to set the convergence criteria. Along with smaller values of μ, longer durations spent at task 1114 further increase the effective resolution and further decrease the effective-error level of the return-data stream. Task 1114 may simply determine whether sufficient time has been spent to achieve convergence, or task 1114 may monitor filter coefficients being generated by adaptation engine 1300 and determine that convergence has occurred when no consistent pattern of change in filter coefficients is detected.

When task 1114 has determined that convergence has occurred, a query task 1115 determines whether subprocess 1100 has been invoked to include heat processing along with filter-coefficient determination. In connection with forward and return equalizers 246 and 260 and in connection with the initial coefficient-determination iterations of equalizers 226, no heat processing is included. In these scenarios, program control passes to a task 1116. The heat processing scenarios are discussed below in connection with FIGS. 15 and 17.

Task 1116 locks adaptation engine 1300 by setting the filter-coefficient-convergence factor μ=0 and the heat-convergence factor λ=0. Next, a task 1118 reads the set of filter coefficients and heat-sensitivity coefficients at feature 236 of adaptation engine (AE) 1300. After tasks 1116 and 1118, a task 1120 programs this set of filter coefficients into the subject non-adaptive equalizer 1200, and a task 1122 decouples adaptation engine (AE) 1300 from the non-adaptive equalizer 1200. When subprocess 1100 is being used to determine heat-sensitivity coefficients, task 1120 also programs the set of heat-sensitivity coefficients into the subject non-adaptive equalizer 1200.

Decoupling may be accomplished by selecting the controller data input at the subject multiplexer 1232 or 1234 rather than the adaptation engine data input. At this point, a set of filter coefficients and possibly a set of heat-sensitivity coefficients has been determined by adaptation engine 1300, that filter-coefficient set and heat-sensitivity coefficient set has been programmed back into non-adaptive equalizer 1200, adaptation engine 1300 is now available to determine another filter-coefficient set, and routine 1106 is complete. The just-determined filter-coefficient set and heat-sensitivity coefficient set will desirably remain static. But, the filter-coefficient set may continue to be adjusted within non-adaptive equalizers in response to delta-heat signal 216 and heat-sensitivity coefficients.

Following task 1122 and routine 1106, a task 1124 initializes the mode of adaptation engine 1300 to determine cross-path coefficients for the subject non-adaptive equalizer 1200. Adaptation engine 1300 may be initialized to cross-path-filter-coefficient adaptation by controlling selective inversion circuits 1320 so that they invert the weighted quadrature signals they process. Next, a task 1126 repeats routine 1106 for this other filter-coefficient set. When task 1126 has completed the other filter-coefficient set, subprocess 1100 is complete.

Referring back to FIG. 5, upon the completion of subprocess 1100, subprocess 500 is likewise complete. At this point, forward equalizer 246 of linear predistorter 244 has been programmed with forward-filter coefficients that compensate for linear distortion in the RF-analog signal 134 at the input of HPA 136 caused by analog components 120. In particular, forward equalizer 246 can now compensate for frequency-dependent gain and phase imbalance and also for quadrature imbalance caused by differences in gain and delay between the legs of the complex communication signal. Accordingly, the RF-analog signal at the input of HPA 136 is as nearly an ideal signal as possible, with the linear distortion caused by analog components 120 upstream of HPA 136 accounted for by predistortion introduced through linear predistorter 244.

Referring back to high-pass filter 205 in FIG. 1 and to high-pass filters 314 in FIG. 3, each high-pass filter asserts only a very small influence. In particular, in order to block DC, some small amount of near-DC energy is also blocked by high-pass filters 314 in the return path. But for this near-DC hole in the spectrum, the return path is used to drive forward equalizer 246 to match the return path. Thus, adaptation engine 1300 has determine forward-filter coefficients that control the linear distortion in forward stream, except for near-DC energy. High-pass filter 205 merely removes this near-DC energy from the forward stream so that all energy passing through forward equalizer 246 is controlled for linear distortion.

Upon the completion of subprocess 500, a subprocess 1400 is performed to extend the compensation of linear distortion through HPA 136. Since a substantially undistorted signal is now present at the input to HPA 136, HPA 136 will now amplify a signal that more closely meets the controlled conditions that HPA models are designed to model. Moreover, at this point, no nonlinear compensation has been introduced into the forward-data stream, and the substantially undistorted signal presented to HPA 136 includes substantially only in-band frequency components.

Figure 14:
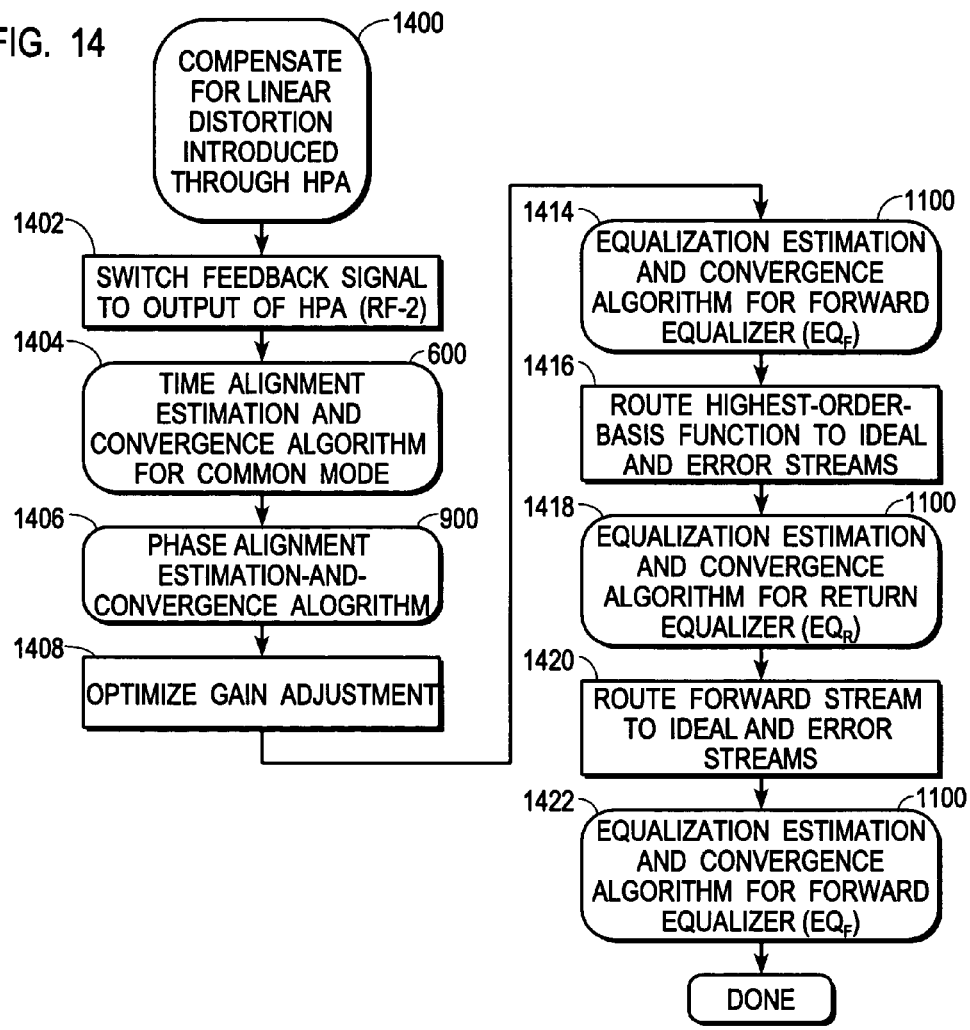
FIG. 14 shows a flow chart of a subprocess of the process depicted in FIG. 4, wherein this subprocess compensates for linear distortion introduced through the HPA.

FIG. 14 shows a flow chart of subprocess 1400. Subprocess 1400 includes a task 1402 which switches the feedback signal provided to downconversion section 300 by multiplexer 250 from the input of HPA 136 to the RF-analog signal generated at the output of HPA 136. Since the feedback signal now propagates through HPA 136, it experiences additional delay and additional phase rotation compared to the feedback signal derived from the input of HPA 136. Next, a task 1404 invokes subprocess 600 to implement an estimation-and-convergence algorithm for common-mode-time-alignment section 700. As a result, the "ideal" delayed-complex-forward-data stream 266 is brought back into temporal alignment with complex-return-data stream 262. No further differential-time alignment should be required at this point because both legs of the complex communication signal have been combined prior to processing in HPA 136. Since the same analog component (i.e., HPA 136) processes both legs of the combined signal, no opportunity for further differential quadrature time imbalance exists.

After task 1404, a task 1406 invokes subprocess 900 to implement an estimation-and-convergence algorithm to realign the phase of aligned-complex-forward-data stream 272 with complex-return-data stream 262. As a result, the "ideal" aligned-complex-forward-data stream 272 is brought back into phase alignment with complex-return-data stream 262.

Following phase realignment in task 1406, a task 1408 optimizes the gain adjustment provided by adjustable attenuators 302 and 256 in a manner similar to that performed above in task 508. After task 1408, a task 1414 invokes subprocess 1100 to implement an estimation-and-convergence algorithm for forward equalizer 246 to increase correlation between HPA-output-RF-analog signal 117 and the "ideal" forward-data stream. As a result the forward-filter coefficients programmed into forward equalizer 246 are revised to compensate for linear distortion introduced by HPA 136. In particular, such linear distortion may be introduced by input band-pass filter (BPF) 140 and output band-pass filter (BPF) 144 of the Wiener-Hammerstein HPA model. But, at this point, the linear compensation covers the wideband signal that does not include nonlinear components.

After task 1414 a task 1416 controls multiplexer 222 to route highest-ordered-basis-function-data stream 214', rather than forward-data stream 218, toward adaptation engine 1300. As discussed above, highest-ordered-basis-function-data stream 214' exhibits the same timing as forward-data stream 218, and basis-function generation section 1600 does not implement processing to rotate the quadrature phase of highest-ordered-basis-function-data stream 214' in the preferred embodiment. Consequently, no further time or phase alignment should be required to bring highest-ordered-basis-function-data stream 214' into alignment with return-data stream 262. For purposes of linear compensation, one significant difference between highest-ordered-basis-function-data stream 214' and forward-data stream 218 is that highest-ordered-basis-function-data stream 214' exhibits the super-wideband discussed above.

Referring to the Wiener-Hammerstein HPA model depicted in FIG. 1, amp 142 can introduce nonlinear distortion, which will result in out-of-band frequency components being processed by output band-pass filter (BPF) 144, where they may experience linear distortion. In order to compensate for this linear distortion of output band-pass filter (BPF) 144, a task 1418 again invokes subprocess 1100 to implement an estimation-and-convergence algorithm. But this time subprocess 1100 is invoked for return equalizer 260 to adjust the return-data stream so that the HPA-RF-analog-output signal 117 reflected by the return-data stream is maximally correlated with the super-wideband, highest-ordered-basis-function-data stream 214'. The higher-ordered terms do not appear to a significant degree in the forward-propagating signal until the output of the memoryless nonlinearity portion (i.e., amp 142) of the Wiener-Hammerstein HPA model. But as these higher-ordered terms pass through output BPF 144 of the Wiener-Hammerstein HPA model, they may experience linear distortion. Thus, linear distortion is compensated over the wider bandwidth that output BPF 144 must process.

This operation further compensates for linear distortion appearing at the output of HPA 136 but does not adjust the HPA output signal. Rather, this operation makes an adjustment in the return-signal path that allows subsequent training for nonlinear compensation to rely on linear-distortion-compensated signals. As a result of task 1418, return-filter coefficients are determined through an estimation-and-convergence algorithm and programmed into return equalizer 260. And, the return-data stream is as precise a replica of the output of the memoryless nonlinearity portion (i.e., amp 142) of the Wiener-Hammerstein HPA model as can be achieved.

Next, a task 1420 controls multiplexer 222 to route forward-data stream 218 toward adaptation engine 1300 rather than highest-ordered-basis-function-data stream 214'. Then, a task 1422 again invokes subprocess 1100 to implement an estimation-and-convergence algorithm. This time subprocess 1100 is invoked for forward equalizer 246 to remove any correlation that may appear between the return-data and forward-data streams now that return equalizer 260 has been programmed to address linear distortion of output band-pass filter 144. This operation is particularly aimed at compensating for linear distortion that may be introduced by input band-pass filter (BPF) 140.

Following task 1422, subprocess 1400 is complete and linear-and-nonlinear-predistortion circuit 200 has been trained to compensate for linear distortions. As nearly an ideal signal as possible is provided to HPA 136 so that HPA 136 now amplifies a signal that most closely matches the controlled conditions for which amplifier models are devised. Moreover, sources of linear distortion following amp 142 have been compensated so that nonlinear distortion training can now take place without substantial degradation from linear distortion.

Referring back to FIG. 4, following subprocess 1400, transmission-distortion-management process 400 now performs a task 402 to invoke a subprocess 1500. Subprocess 1500 compensates for nonlinear distortion introduced by HPA 136. More specifically, at task 402 subprocess 1500 compensates for nonlinear distortion without compensating for heat-induced-memory effects.

Figure 15:
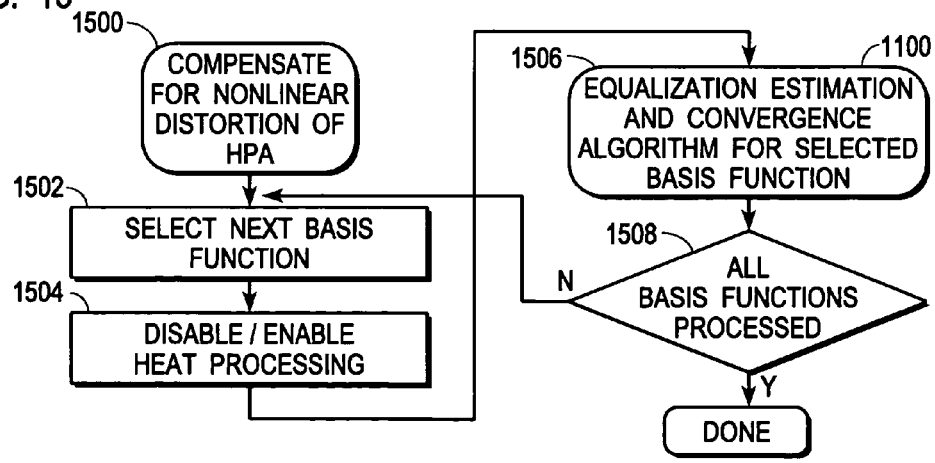
FIG. 15 shows a flow chart of a subprocess of the process depicted in FIG. 4, wherein this subprocess compensates for nonlinear distortion of the HPA.

FIG. 15 shows a flow chart of subprocess 1500. Generally, subprocess 1500 is configured for compatibility with the Wiener-Hammerstein HPA model. In particular, nonlinear distortion is assumed to be in the form of higher-ordered harmonics of the signal being amplified. The signal being amplified at amp 142 in this model is now closely matched to the "ideal" signal that drives basis-function-generation section 1600 due to the above-discussed linear compensation. And, basis-function-generation section 1600 generates higher-ordered harmonics of this signal. Nonlinear predistorter 224 filters these higher-ordered harmonics, where they are then combined together with the ideal signal in a subtractive fashion.

Subprocess 1500 includes a task 1502 to select a next basis function from the basis functions generated by basis-function-generation section 1600. At the first iteration of task 1502, any of the basis functions, from the $2^{nd}$ order basis function to the $K^{th}$ order basis function may be selected. Otherwise, task 1502 preferably selects the basis function that has not been selected for the longest period of time by a prior iteration of task 1502. Subsequent tasks will train the equalizer 226 allocated for the selected basis function by determining filter coefficients for the equalizer 226 and programming those filter coefficients into the equalizer 226.

In the preferred embodiments, the basis functions are substantially orthogonal to one another. By being orthogonal to one another, filtering applied to one of the basis functions will have a minimal impact on other basis functions. Moreover, when the filtering changes for one basis function, those changes are less likely to influence the other basis functions.

Figure 16:
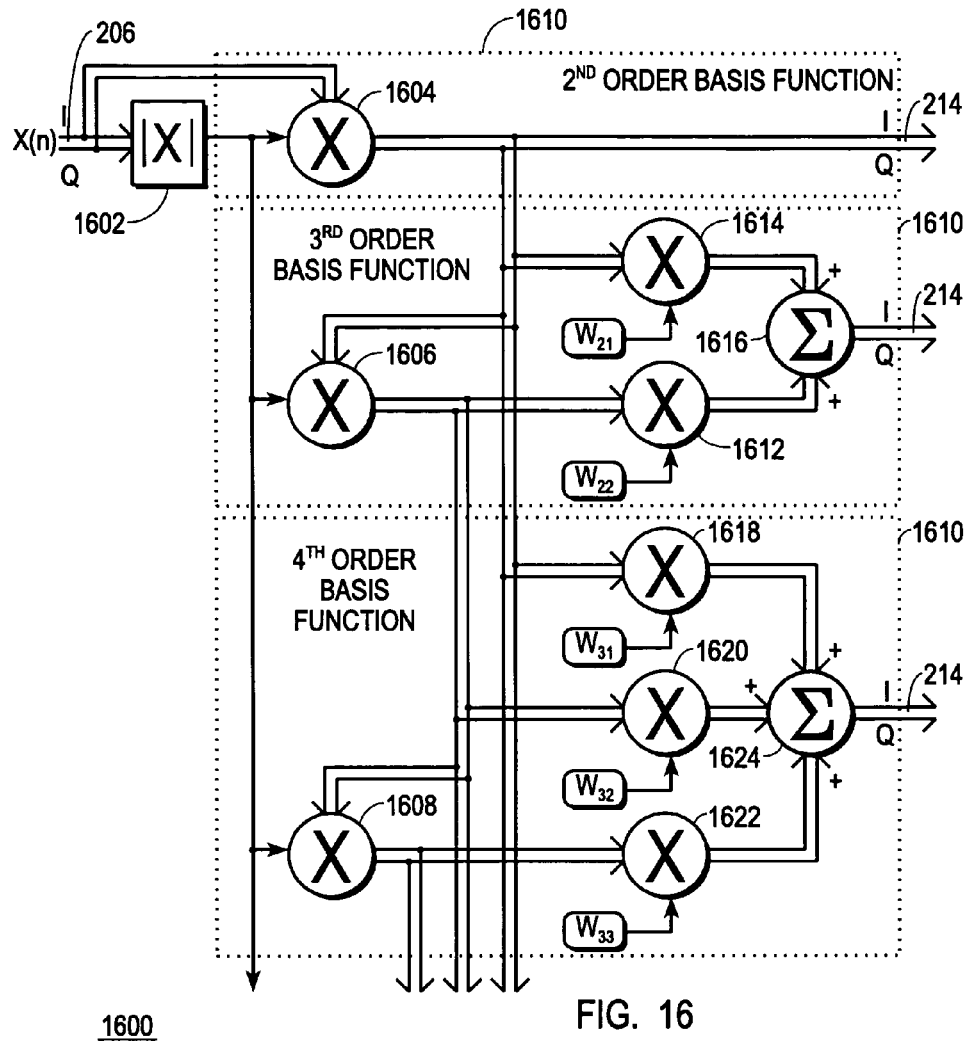
FIG. 16 shows a block diagram of a basis-function-generation section suitable for use in the linear-and-nonlinear-predistortion section of the transmitter depicted in FIG. 1.

FIG. 16 shows a block diagram of one embodiment of a basis-function-generation section 1600 suitable for use in the linear-and-nonlinear-predistortion circuit 200. This embodiment is desirable because it achieves substantially orthogonal basis functions using a relatively simple hardware implementation. Moreover, it is responsive to a high-resolution, low error input data stream and likewise provides high-resolution, low error output data streams as a result. But while basis-function-generation section 1600 provides suitable results for the purposes of linear-and-nonlinear-predistortion circuit 200, those skilled in the art will be able to devise acceptable alternate embodiments.

Complex-forward-data stream 206 is received at a magnitude circuit 1602 and at a multiplier 1604. Magnitude circuit 1602 generates a scalar-data stream that describes the magnitude of complex-forward-data stream 206 and routed to multiplier 1604, as well as multipliers 1606 and 1608. FIG. 16 indicates that basis-function-generation section 1600 is segmented into cells 1610, with each cell generating one basis function. Multipliers 1604, 1606, and 1608 are respectively associated with different cells 1610. Generally, each basis function is responsive to $X(n) \cdot |X(n)|^K$, where $X(n)$ represents the forward-data stream 206 received by section 1600, and K is an integer number greater than or equal to one. The outputs of multipliers 1604, 1606, and 1608 are $X(n) \cdot |X(n)|^K$ streams.

But in order to achieve substantial orthogonality, each basis function equals the sum of an appropriately weighted $X(n) \cdot |X(n)|^K$ stream and all appropriately weighted lower-ordered $X(n) \cdot |X(n)|^K$ streams. Accordingly, the output from multiplier 1604 directly serves as the $2^{nd}$ order basis function, and provides one of complex-basis-function-data streams 214. The output from multiplier 1606 is multiplied by a coefficient $W_{22}$ at a multiplier 1612, and the output from multiplier 1604 is multiplied by a coefficient $W_{21}$ at a multiplier 1614. The outputs of multipliers 1612 and 1614 are added together in an adder 1616, and the output of adder 1616 serves as the $3^{rd}$ order basis function and provides another of complex-basis-function-data streams 214. Likewise, the output from multiplier 1604 is multiplied by a coefficient $W_{31}$ in a multiplier 1618; the output from multiplier 1606 is multiplied by a coefficient $W_{32}$ in a multiplier 1620; and, the output of multiplier 1608 is multiplied by a coefficient $W_{33}$ in a multiplier 1622. Outputs of multipliers 1618, 1620, and 1622 are added together in an adder 1624. The output of adder 1624 serves as the $4^{th}$ order basis function and provides yet another of complex-basis-function-data streams 214. In the preferred embodiment, the coefficients are determined during the design process by following a Gram-Schmidt orthogonalization technique, or any other orthogonalization technique known to those skilled in the art. As such, the coefficients remain static during the operation of transmitter 100. But nothing prevents the coefficients from changing from time-to-time while transmitter 100 is operating if conditions warrant.

Those skilled in the art will appreciate that basis-function-generation section 1600 may be expanded by adding additional cells 1610 to provide any desired number of basis functions. Moreover, those skilled in the art will appreciate that pipelining stages may be added as needed to accommodate the timing characteristics of the components involved and to insure that each basis function has substantially equivalent timing. The greater the number of basis functions, the better nonlinear distortion may be compensated for. But the inclusion of a large number of basis functions will necessitate processing a very wideband, super-wideband signal. The preferred embodiments contemplate the use of 2–5 basis functions, but this is no requirement of the present invention.

Referring back to FIG. 15, after a basis function has been selected in task 1502, a task 1504 either disables or enables heat processing. Task 1504 disables heat processing if subprocess 1500 is being invoked from task 402. Next, a task 1506 calls subprocess 1100 to implement an estimation-and-convergence algorithm to determine appropriate filter coefficients for the non-adaptive equalizer 226 associated with the selected basis function. During initialization and during linear compensation, the selected non-adaptive equalizer may have been disabled by setting all its filter coefficients to zero. During task 1506, filter coefficients are determined for this non-adaptive equalizer 226 that minimize any correlation between the forward-data and error streams, and maximize correlation between the forward-data and return-data streams. To the extent that orthogonal basis functions are used, the increase in correlation between the forward-data and return-data streams for any one basis function will have no correlating influence on the other basis functions.

Following task 1506, a query task 1508 determines whether all basis functions have been processed by subprocess 1500, so long as other basis functions remain to be processed, program control loops back to task 1502 to determine filter coefficients for the remaining basis functions. When task 1508 determines that all basis functions have been processed, subprocess 1500 is complete.

Referring back to FIG. 4, after task 402 invokes subprocess 1500, a task 404 again invokes subprocess 1500. This time subprocess 1500 to train for nonlinear compensation with heat processing. Thus, the processing of delta-heat signal 216 will be enabled at task 1504 in subprocess 1500. Referring to FIG. 13, heat processing may be enabled by enabling one-cycle delay elements 1348 in adaptation engine 1300.

Figure 17:
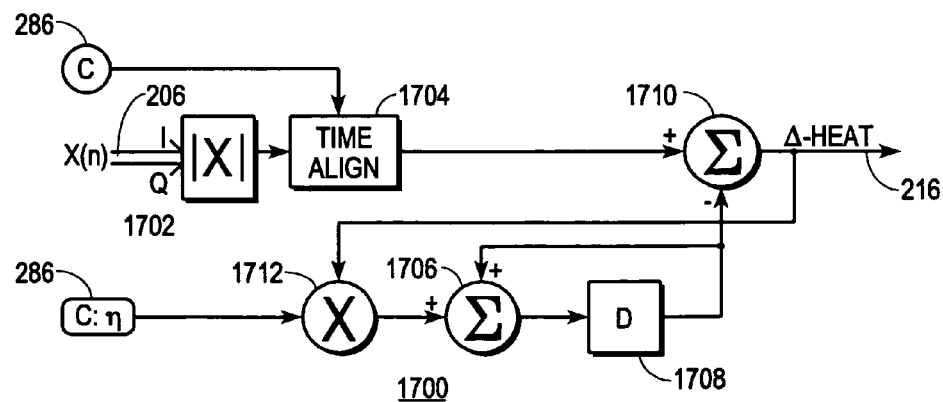
FIG. 17 shows a block diagram of a representative heat-estimation section suitable for use in the linear-and-nonlinear-predistortion section of the transmitter depicted in FIG. 1.

FIG. 17 shows a block diagram of one embodiment of a representative heat-change-estimation section 1700 suitable for use in the linear-and-nonlinear-predistortion circuit 200. This embodiment is desirable because it configures delta-heat signal 216 to be responsive to instantaneous changes from the long-term average relative power exhibited by the forward-data stream and it uses a relatively simple hardware implementation. But while heat-change-estimation section 1700 provides suitable results for the purposes of linear-and-nonlinear-predistortion circuit 200, those skilled in the art will be able to devise alternate embodiments that will also work.

Complex-forward-data stream 206 is received at a magnitude-determining circuit 1702 in heat-change-estimation section 1700. At circuit 1702, the magnitude of the complex signal is formed, thereby making a scalar magnitude signal that drives a programmable time-alignment section 1704. In one embodiment, magnitude-determining circuit 1702 provides a stream of magnitude values responsive to the magnitude of complex-forward-data stream 206, and in another embodiment, circuit 1702 provides this stream of magnitude values raised to a power greater than one.

Programmable time-alignment section 1704 receives programming inputs from controller (C) 286. Programmable time-alignment section 1704 may be configured in a manner similar to that described above in connection with FIGS. 7 and 8. In other words, section 1704 allows controller 286 to alter the delay the stream of magnitude values experiences in section 1704. Section 1704 provides a delayed stream of magnitude values to an IIR filter in one embodiment.

The IIR filter provides an average-magnitude output at an output of an adder 1706, but this average-magnitude output is not the output for heat-change-estimation section 1700. The average-magnitude output provides a present-time representation of a long-term average magnitude signal. This signal is routed to a one-cycle delay element 1708, whose output provides a previous representation of the long-term average magnitude signal. The previous representation of the long-term average magnitude signal is routed to a first input of adder 1706 and to a negative input of a subtraction circuit 1710. The delayed stream of magnitude values from time-alignment section 1704 is provided to a positive input of subtraction circuit 1710, and the output of subtraction circuit 1710 provides delta-heat signal 216, which is the output for heat-change-estimation section 1700. Delta-heat signal 216 is routed back to a first input of a convergence multiplier 1712, and a convergence value $\eta$ is supplied by controller (C) 286 to a second input of convergence multiplier 1712. An output of convergence multiplier 1712 couples to a second input of adder 1706.

Thus, the long-term average magnitude signal reflects the average magnitude, or a power greater than one thereof, over time of forward-data stream 206, and it is updated during each clock cycle by a fraction of the current instantaneous magnitude value. The size of that fraction is determined by convergence value $\eta$. Smaller convergence values $\eta$ make the long-term average magnitude signal less responsive to instantaneous magnitude values. Moreover, delta-heat signal 216 characterizes the deviation of the instantaneous magnitude from the long-term average magnitude signal.

Referring back to FIGS. 4 and 15, during task 404 of transmission distortion management process 400, filter coefficients for equalizers 226 continue to be adjusted. In addition, during task 404 heat-sensitivity coefficients for equalizers 226 are adjusted in response to delta-heat signal 216. Each iteration of task 1506, which is invoked through task 404, now invokes equalization estimation-and-convergence algorithm subprocess 1100 to determine both filter coefficients and heat-sensitivity coefficients.

Referring to FIG. 11, the query task 1115 is performed when subprocess 1100 has converged to a solution for a set of filter coefficients. Task 1115 determines whether heat processing is to be included. During task 404, when heat processing is to be included, program control proceeds to a tasks 1128, 1130, and 1132. Tasks 1128, 1130, and 1132 are optional tasks that are desirably performed the first time program control proceeds along this path for the purposes of initialization, and thereafter performed only occasionally. In one embodiment, tasks 1128, 1130, and 1132 are performed only during the first iteration of the programming loop set forth in subprocess 1500.

Task 1128 couples correlation engine (CE) 280 to correlate delta-heat signal 216 with delta-coefficient signal 279 by making the appropriate selections at multiplexers 270 and 278. Then, task 1130 performs a time alignment optimization operation. In particular, delta-heat signal 216 is delayed by making increasingly accurate delay estimates until convergence is reached where maximum correlation results are observed when delta-heat signal 216 is correlated with delta-coefficient signal 279. An optimizing algorithm similar to that discussed above in connection with FIG. 6 may be used in task 1130, or another optimizing algorithm may also be used. At this point, delta-heat signal 279 has been brought into time alignment at the middle of adaptation engine 1300. Changes in the heat of EPA 136, as indicated by the power of the forward-data stream, track changes in the filter coefficient for the middle tap to the maximum extent possible.

After task 1130, task 1132 performs another optimizing operation. At task 1132 the convergence values $\eta$ and $\gamma$ are optimized. Convergence values $\eta$ and $\gamma$ determine the sensitivity of long-term averages to instantaneous changes in the power and middle-filter-coefficient signals. Desirably, convergence values $\eta$ and $\gamma$ are small positive values so that the long-term averages are fairly insensitive to instantaneous changes. But convergence values $\eta$ and $\gamma$ are optimized by making increasingly accurate estimates for these values until substantially maximal correlation results are observed at correlation engine 280.

Next, a task 1134 sets the convergence criteria, in part, for the heat portion of the estimation-and-convergence algorithm and unlocks adaptation engine (AE) 1300 to perform heat-sensitivity-coefficient processing along with filter-coefficient processing. The partial setting of the convergence criteria and the unlocking of adaptation engine 1300 may both be accomplished by supplying adaptation engine 1300 with a positive value for the convergence variable $\lambda$. Desirably, this value is a fraction far less than one. The convergence criteria determine how many samples adaptation engine 1300 will process before it can be deemed as having converged upon a heat-sensitivity-coefficient-set solution. As discussed above, a greater number of samples processed leads to a greater increase in effective resolution, or reduction in error level, in the return-data stream. An increase in algorithmic processing time is thus transformed into a reduced effective-error level for the return-data stream. Through task 1134, the rate of convergence is controlled to achieve a predetermined effective return-error level less than the error level associated with the return-data stream. In one embodiment, the convergence variable $\lambda$ is initially set to a somewhat higher value, but decreases over time.

Following task 1134, adaptation engine 1300 will now implement two least mean square (LMS), estimation-and-convergence algorithms. In one algorithm filter-coefficient estimates are continuously altered to minimize the error signal provided by data stream 276. In the other, heat-sensitivity coefficient estimates are continuously altered to minimize the error signal provided by the difference between delta-heat signal 216 and delta-correlation signals 1338. Both LMS, estimation-and-convergence algorithms repetitively revise filter coefficients and heat-sensitivity coefficients to minimize the respective error signals.

At this point, a query task 1136 determines whether the heat-sensitivity coefficients being determined by adaptation engine 1300 may be deemed as having converged. Task 1136 works in conjunction with task 1134 to set the convergence criteria. Task 1136 may simply determine whether sufficient time has been spent to achieve convergence, or task 1136 may monitor heat-sensitivity coefficients being generated by adaptation engine 1300 and determine that convergence has occurred when no consistent pattern of change in filter coefficients is detected.

When task 1136 has determined that convergence has occurred, heat-sensitivity coefficients a have been determined which, when multiplied by delta-heat signal 216, cause the heat signal to become maximally correlated with corresponding delta-coefficient signals 1338. At this point, program control proceeds to task 1116 to lock adaptation engine 1300, extract filter coefficients and heat-sensitivity coefficients from adaptation engine 1300, and program those coefficients back into the subject non-adaptive equalizer 226. Heat-adapter units 1234 will then subsequently adjust filter coefficients in response to delta-heat signal 216 as weighted by corresponding heat-sensitivity coefficients, to compensate for heat buildup or drainage in HPA 136.

Referring back to FIG. 4, after task 404, linear-and-nonlinear-predistortion circuit 200 has compensated for both linear and nonlinear distortion introduced by analog components 120. But not all distortion has been removed from HPA-RF-analog-amplifier signal 117 by predistortion circuit 200, and some residual amount will remain. The residual distortion will contribute to error-vector magnitude (EVM). Two forms of residual distortion will contribute to EVM, one linear and the other nonlinear. Desirably, overall EVM resulting from the use of transmitter 100 is held as low as possible so that reception of communications signal 116 is as good as possible. But industry standards are configured to achieve acceptable reception while nevertheless permitting a certain amount of EVM. Of the two forms of residual distortion contributing to EVM, nonlinear distortion is considered worse because it leads to spectral regrowth in addition to degraded reception. The component of EVM resulting from linear distortion may lead to degraded reception but does not substantially worsen spectral regrowth.

Distortion introduced by peak-reduction section 110 is another contributor to EVM. In general, peak-reduction section 110 will introduction greater amounts of distortion as greater amounts of peak reduction are applied to the forward-data stream. But the distortion introduced by peak-reduction section 110 will be in-band distortion, and will not substantially contribute to spectral regrowth. It may therefore be desirable in some applications to detect if EVM resulting from nonlinear distortion has increased, and tradeoff this form of distortion for the more benign form of in-band distortion.

Accordingly, after task 404 a task 406 obtains a residual-nonlinear-EVM value. The residual-nonlinear-EVM value is an estimate of the amount or residual distortion remaining in HPA-RF-analog-amplifier signal 117 after linear and non-linear compensation that is due to nonlinear distortion. Task 406 may, for example, obtain the residual-nonlinear-EVM value by controlling multiplexers 270 and 278 so that the error stream 276 is correlated with itself in correlation engine 280, then do at least two correlations. One of the two correlations will measure the error signal resulting from the analog signal that is input to EPA 136 and the other will measure the error signal resulting from the analog signal that is output from EPA 136. Of course, timing, phase alignment, and gain adjustments may be performed as described herein prior to each correlation. Desirably, suitable convergence criteria are used for the two correlation operations so that the effective-error level of error stream 276 is significantly decreased as discussed above.

Then task 406 can obtain the residual-nonlinear-EVM value by evaluating the difference between the two correlations. The difference results primarily from the memory-less nonlinearity 142 of HPA 136 and represents nonlinear distortion. While a variety of noise sources will contribute to the results of each correlation, those noise sources are, for the most part, common to each correlation operation. Thus, the difference between the two correlations yields a residual-nonlinear-EVM value that is substantially isolated from the noise sources.

Following task 406, a task 408 evaluates whether the residual-nonlinear-EVM value is excessive when compared to a predetermined value. An excessive value may result from an aging but not yet failed HPA 136, power supply aging, operation at extreme temperature, or a variety of other scenarios. If the residual-nonlinear-EVM value is excessive, then task 408 provides peak-reduction-feedback signal 114 to peak-reduction section 110. Feedback signal 114 is based upon the residual-nonlinear-EVM value obtained above in task 406. In response to feedback signal 114, peak-reduction section 110 will alter the peak reduction it applies to the forward-data stream as discussed above. In particular, when an excessive residual-nonlinear-EVM value is detected, peak reduction is increased so that HPA 136 may operate at a greater backoff, which will lead to reduced nonlinear distortion. The increase in peak reduction will likewise increase linear distortion, but should also decrease nonlinear distortion somewhat. Transmitter 100 will henceforth operate with less nonlinear distortion but more linear distortion. Reception will gracefully degrade, but spectral regrowth will be substantially prevented. In addition, task 408 may activate alarms or otherwise automatically send control messages indicating the excessive residual-nonlinear EVM condition.

After task 408 program control loops back to any of the subprocesses and tasks in process 400 so that each subprocess and task is repeated from time to time on a suitable schedule.

In summary, an improved predistortion circuit and method for compensating linear distortion in a digital RF communications transmitter is described herein; an improved predistortion circuit and method for compensating nonlinear distortion in a digital RF communications transmitter are described herein; and, an improved distortion-managed digital RF communications transmitter and method are provided. A feedback-driven equalizer section is included in a digital communications transmitter to filter a digital communications signal and to compensate for frequency-dependent-quadrature-gain-and-phase imbalance introduced by analog-transmitter components. A complex-digital-subharmonic-sampling downconverter is adapted to receive a feedback signal from analog-transmitter components to improve accuracy in capturing the feedback signal. Estimation-and-convergence algorithms are used to process a feedback signal obtained from analog components to minimize processing complexity while at the same time reducing errors in the feedback signal. An equalization section which filters a digital communications signal includes an adaptive equalizer that implements an estimation and convergence algorithm to determine filter coefficients that compensate for frequency dependent quadrature gain and phase imbalance introduced by analog-transmitter components. A basis-function-generation section generates at least one complex-basis function in response to a complex-forward-data-stream, and a filter filters the basis function to generate a complex-filtered-basis-function-data stream that is combined back with the complex-forward-data-stream to compensate for nonlinear distortion. An equalizer is included in a digital communications transmitter to filter a basis function to exhibit characteristics that cause it to compensate nonlinear distortion. Heat-induced memory effects are compensated for with little increase in complexity. A linear predistorter is trained to compensate for linear distortion prior to training a nonlinear predistorter to compensate for nonlinear distortion to improve accuracy in the training of the nonlinear predistorter.

Although the preferred embodiments of the invention have been illustrated and described in detail, it will be readily apparent to those skilled in the art that various modifications may be made therein without departing from the spirit of the invention or from the scope of the appended claims. For example, differential-mode-time-alignment section 800 or phase-rotate section 1000 may be omitted, particularly when forward equalizer 246 has a generous number of taps. Or, section 800 may be implemented differently, such as through the generation of clock signals for I and Q legs using independent phase-locked loops. Adaptation engine 1300 could be configured as an adaptation engine that simultaneously operates on all paths of a complex equalizer rather than just two paths as described above, as an entire adaptive equalizer switched into and out from the respective data streams to determine filter coefficients, or all non-adaptive equalizers could be implemented using adaptive equalizers even though power and chip area would increase as a result. These and other modifications and adaptations which are obvious to those skilled in the art are to be included within the scope of the present invention.

What is claimed is:

1. A method of managing distortion in a digital communications transmitter in which at least a portion of said distortion is introduced by analog-transmitter components, said method comprising:

obtaining a forward-data stream configured to convey digital information;

down-converting a feedback signal obtained from said analog-transmitter components using a digital-subharmonic-sampling downconverter to generate a return-data stream;

training a linear predistorter which is responsive to said forward-data stream and is located upstream of said analog-transmitter components to compensate for linear distortion introduced by said analog-transmitter components, said linear predistorter training activity including determining filter coefficients for an equalizer which filters said forward-data stream and processing said return-data-stream to generate said filter coefficients; and training a nonlinear predistorter which is responsive to said forward-data stream and is located upstream of said analog-transmitter components to compensate for nonlinear distortion introduced by said analog-transmitter components.

2. A method as claimed in claim 1 wherein:

said linear predistorter comprises a first equalizer, and said nonlinear predistorter comprises a second equalizer;

said linear-predistorter-training activity comprises operating said first equalizer in an adaptive mode to compensate for said linear distortion; and said nonlinear-predistorter-training activity comprises operating said second equalizer in an adaptive mode to compensate for said nonlinear distortion.

3. A method as claimed in claim 2 wherein:

said linear-predistorter-training activity operates said first equalizer in a non-adaptive mode when said second equalizer is operated in said adaptive mode; and said nonlinear-predistorter-training activity operates said second equalizer in a non-adaptive mode when said first equalizer is operated in said adaptive mode.

4. A method as claimed in claim 1 wherein said nonlinear-predistorter-training activity occurs after said linear-predistorter-training activity.

5. A method as claimed in claim 1 wherein said processing activity controls one or more estimation-and-convergence algorithms to generate said filter coefficients.

6. A method as claimed in claim 5 wherein said one or more estimation-and-convergence algorithms are responsive to said forward-data stream and to said return-data stream;

said forward-data stream and said return-data stream exhibit forward-error and return-error levels, respectively, with said return-error level being greater than said forward-error level; and said one or more estimation-and-convergence algorithms are configured to transform increased algorithmic processing time into reduced effective-error level for said return-data stream.

7. A method as claimed in claim 1 wherein said forward-data stream is provided by a peak-reduction section, said analog-transmitter components include a power amplifier which produces a power-amplifier-output signal, and said method additionally comprises:

obtaining an residual value that estimates uncompensated nonlinear distortion introduced by said analog-transmitter components into said power-amplifier-output signal; and operating said peak-reduction section so that an amount of peak reduction imposed in said forward-data stream is responsive to said residual value.

8. A method as claimed in claim 1 wherein:

each of said linear-predistorter-training and nonlinear-predistorter-training activities processes a return-data stream obtained from said analog-transmitter components;

said forward-data stream exhibits a forward resolution; and said return-data stream exhibits a return resolution less than said forward resolution.

9. A method as claimed in claim 8 wherein said return resolution is at most four bits less than said forward resolution.

10. A method as claimed in claim 1 wherein:

each of said linear-predistorter-training and nonlinear-predistorter-training activities processes a return-data stream obtained from said analog-transmitter components;

each of said linear-predistorter-training and nonlinear-predistorter-training activities implements an estimation-and-convergence algorithm responsive to said forward-data stream and to said return-data stream;

said forward-data stream and said return-data stream exhibit forward-error and return-error levels, respectively, with said return-error level being greater than said forward-error level; and said estimation-and-convergence algorithm controls a rate of convergence to achieve a predetermined effective return-error level that is less than said return-error level.

11. A method as claimed in claim 1 wherein:

each of said linear-predistorter-training and nonlinear-predistorter-training activities processes a return-data stream obtained from said analog-transmitter components;

each of said linear-predistorter-training and nonlinear-predistorter-training activities implements an estimation-and-convergence algorithm responsive to said forward-data stream and to said return-data stream; and said estimation-and-convergence algorithm estimates filter coefficients which influence said forward-data and return-data streams, generates an error signal by combining said forward-data and return-data streams, and repetitively revises said filter coefficients to minimize said error signal and to decorrelate said error signal from said forward-data stream.

12. A method as claimed in claim 1 additionally comprising:

obtaining a return-data stream from said analog-transmitter components;

delaying said forward-data stream to form a delayed-forward-data stream in temporal alignment with said return-data stream;

forming an error signal by combining said delayed-forward-data stream and said return-data stream; and performing said linear-predistorter-training and nonlinear-predistorter-training activities by implementing an estimation-and-convergence algorithm that converges upon filter coefficients which minimize said error signal.

13. A method as claimed in claim 1 wherein:

said linear predistorter comprises a first non-adaptive equalizer, and said nonlinear predistorter comprises a second non-adaptive equalizer;

said linear-predistorter-training activity comprises coupling an adaptation engine to said first non-adaptive equalizer to determine filter coefficients for said first non-adaptive equalizer;

said method additionally comprises decoupling said adaptation engine from said first non-adaptive equalizer; and said nonlinear-predistorter-training activity comprises coupling said adaptation engine to said second non-adaptive equalizer to determine filter coefficients for said second non-adaptive equalizer.

14. A method as claimed in claim 1 wherein:

said analog-transmitter components include a power amplifier which is driven by a power-amplifier-input signal and which produces a power-amplifier-output signal; and said linear-predistorter-training activity comprises downconverting said power-amplifier-input signal then downconverting said power-amplifier-output signal.

15. A method as claimed in claim 1 wherein said nonlinear-predistorter-training activity comprises generating a plurality of basis-function-data streams, wherein each basis-function-data stream is responsive to $X(n) \cdot |X(n)|^K$, where $X(n)$ represents said forward-data stream, and K is an integer greater than or equal to one;

estimating filter coefficients for filters that process said basis-function streams;

filtering said basis-function-data streams in said filters to generate a plurality of filtered-basis-function-data streams;

combining said filtered-basis-function-data streams and said forward-data stream; and repetitively revising said filter coefficients to compensate for said nonlinear distortion.

16. A digital communications transmitter comprising:

a source of a forward-data stream configured to digitally convey information;

a nonlinear predistorter coupled to said forward-data-stream source and configured to generate a nonlinear-predistorted-compensation stream from said forward-data stream;

a combiner coupled to said forward-data-stream source and said nonlinear predistorter and configured to generate a nonlinear-predistorted-forward-data stream from said forward-data stream and said nonlinear-predistorted-compensation stream;

a linear predistorter coupled to said combiner and configured to generate a linear-and-nonlinear-predistorted-forward-data stream, said linear-and-nonlinear-predistorted-forward-data stream being routed to analog-transmitter components; and a feedback section having an input adapted to receive an RF-analog signal from said analog-transmitter components and an output coupled to said nonlinear predistorter and to said linear predistorter.

17. A digital communications transmitter as claimed in claim 16 wherein:

said analog-transmitter components include a power amplifier which produces a power-amplifier-output signal;

said transmitter additionally comprises a peak-reduction section coupled to said forward-data-stream source and to said feedback section;

said peak-reduction section generates a peak-reduced-forward-data stream so that said nonlinear predistorter and said combiner operate upon said peak-reduced-forward-data stream; and said peak-reduction section imposes an amount of peak reduction in said peak-reduced-forward-data stream that is responsive to a residual value, said residual value estimating uncompensated nonlinear distortion introduced by said analog-transmitter components into said power-amplifier-output signal.

18. A digital communications transmitter as claimed in claim 17 wherein said peak-reduction section increases said amount of peak reduction when said residual value indicates nonlinear distortion exceeding a predetermined amount.

19. A digital communications transmitter as claimed in claim 16 wherein:

said nonlinear predistorter comprises a first equalizer which operates in an adaptive mode to compensate for nonlinear distortion; and said linear predistorter comprises a second equalizer which operates in said adaptive mode to compensate for linear distortion.

20. A digital communications transmitter as claimed in claim 19 wherein:

said first equalizer is a first-non-adaptive equalizer configured to be programmed with first-filter coefficients;

said second equalizer is a second-non-adaptive equalizer configured to be programmed with second-filter coefficients; and said digital communications transmitter additionally comprises an adaptation engine selectively coupled to and decoupled from said first-non-adaptive and second-non-adaptive equalizers and configured to implement an estimation-and-convergence algorithm which determines said first-filter and second-filter coefficients.

21. A digital communications transmitter as claimed in claim 19 wherein:

said first equalizer operates in a non-adaptive mode when said second equalizer is operating in said adaptive mode; and said second equalizer operates in a non-adaptive mode when said first equalizer is operating in said adaptive mode.

22. A digital communications transmitter as claimed in claim 16 wherein:
    said nonlinear and said linear predistorters selectively operate in respective training modes; and
    said linear predistorter operates in its training mode to compensate for linear distortion prior to operating said nonlinear predistorter in its training mode to compensate for nonlinear distortion.

23. A digital communications transmitter as claimed in claim 16 wherein said feedback section comprises a complex-digital-subharmonic-sampling downconverter adapted to receive said RF-analog signal from said analog-transmitter components and configured to provide a complex-return-data stream.

24. A digital communications transmitter as claimed in claim 23 wherein:
    said forward-data stream exhibits a forward resolution; and
    said complex-return-data stream exhibits a return resolution less than said forward resolution.

25. A digital communications transmitter as claimed in claim 16 wherein:
    said feedback section generates a return-data stream;
    said digital communications transmitter additionally comprises a programmable delay element coupled between said forward-data-stream source and said feedback section; and
    said programmable delay element is configured to produce a delayed-forward-data stream temporally aligned with said return-data stream.

26. A digital communications transmitter as claimed in claim 25 wherein:
    said forward-data stream is a complex-forward-data stream, and said return-data stream is a complex-return-data stream;
    said programmable delay element is a first programmable delay element that adjusts for common mode delay between said complex-return-data and complex-forward-data streams; and
    said digital communications transmitter additionally comprises a second programmable delay element coupled between said forward-data-stream source and said feedback section, said second programmable delay element being configured to adjust for differential mode delay.

27. A digital communications transmitter as claimed in claim 25 wherein:
    said forward-data stream propagates through digital said communications transmitter in response to a clock signal; and
    said programmable delay element includes an integral section that delays said forward-data stream by an integral number of cycles of said clock signal and includes a fractional section that delays said forward-data stream by a fraction of a cycle of said clock signal.

28. A digital communications transmitter as claimed in claim 25 wherein:
    said digital communications transmitter additionally comprises a correlator having inputs coupled to said programmable delay element and to said feedback section; and
    said correlator is configured to implement an estimation-and-convergence algorithm to bring said delayed-forward-data stream into temporal alignment with said return-data stream.

29. A digital communications transmitter comprising:
    analog transmitter components;
    a feedback section adapted to receive an RF-analog signal from said analog-transmitter components;
    a linear predistorter coupled to said feedback section, said linear predistorter being configured to predistort a forward-data stream that digitally conveys information to compensate for linear distortion introduced downstream of said linear predistorter by said analog-transmitter components;
    a nonlinear predistorter coupled to said feedback section, said nonlinear predistorter being configured to predistort said forward-data stream to compensate for nonlinear distortion introduced downstream of said nonlinear predistorter by said analog-transmitter components; and
    a combiner coupled to said linear predistorter and said nonlinear predistorter.

30. A digital communications transmitter as claimed in claim 29 wherein said feedback section comprises a digital-subharmonic-sampling downconverter.

31. A digital communications transmitter as claimed in claim 29 wherein:
    said feedback section comprises an analog-to-digital converter configured to digitize said RF-analog signal into a return-data stream;
    said transmitter additionally comprises a delay element configured to delay said forward-data stream into a delayed-forward-data stream in temporal alignment with said return-data stream;
    said transmitter additionally comprises a combiner configured to form an error signal from said delayed-forward-data stream and said return-data stream; and
    said linear-predistorter is configured to be trained to compensate for said linear distortion introduced by said analog-transmitter components by implementing an estimation-and-convergence algorithm that converges upon filter coefficients which minimize said error signal.

32. A digital communications transmitter as claimed in claim 29 wherein:
    said feedback section comprises an analog-to-digital converter configured to digitize said RF-analog signal into a return-data stream;
    said transmitter additionally comprises a delay element configured to delay said forward-data stream into a delayed-forward-data stream in temporal alignment with said return-data stream;
    said transmitter additionally comprises a combiner configured to form an error signal from said delayed-forward-data stream and said return-data stream; and
    said nonlinear-predistorter is configured to be trained to compensate for said nonlinear distortion introduced by said analog-transmitter components by implementing an estimation-and-convergence algorithm that converges upon filter coefficients which minimize said error signal.

33. A digital communications transmitter as claimed in claim 29 wherein:
    said analog-transmitter components include a power amplifier which produces a power-amplifier-output signal;

said transmitter additionally comprises a peak-reduction section configured to process said forward data stream upstream of said nonlinear predistorter and of said linear predistorter; and said peak-reduction section imposes an amount of peak reduction in said forward-data stream that is responsive to a residual value, said residual value estimating uncompensated nonlinear distortion introduced by said analog-transmitter components into said power-amplifier-output signal.

34. A digital communications transmitter as claimed in claim 29 wherein:

said nonlinear predistorter comprises a first equalizer which operates in an adaptive mode to compensate for said nonlinear distortion; and said linear predistorter comprises a second equalizer which operates in an adaptive mode to compensate for said linear distortion.

35. A method of managing distortion in a digital communications transmitter in which at least a portion of said distortion is introduced by analog-transmitter components, said method comprising:

obtaining a forward-data stream configured to convey digital information;

obtaining an RF-analog signal from said analog-transmitter components;

generating a return-data stream from said RF-analog signal;

forming an error signal by combining said forward-data stream and said return-data stream;

implementing a first-estimation-and-convergence algorithm responsive to said error signal to train a linear predistorter to compensate for linear distortion introduced by said analog-transmitter components; and implementing a second-estimation-and-convergence algorithm responsive to said error signal to train a non-linear predistorter to compensate for nonlinear distortion introduced by said analog-transmitter components.

36. A method as claimed in claim 35 wherein said forward-data stream is provided by a peak-reduction section, said analog-transmitter components include a power amplifier which produces a power-amplifier-output signal, and said method additionally comprises:

obtaining an residual value that estimates uncompensated nonlinear distortion introduced by said analog-transmitter components into said power-amplifier-output signal; and operating said peak-reduction section so that an amount of peak reduction imposed in said forward-data stream is responsive to said residual value.

37. A method as claimed in claim 35 wherein:

said forward-data stream and said return-data stream exhibit forward-error and return-error levels, respectively, with said return-error level being greater than said forward-error level; and said first-estimation-and-convergence and second-estimation-and-convergence algorithms are configured to transform increased algorithmic processing time into reduced effective-error level for said return-data stream.

38. A method as claimed in claim 35 wherein:

said forward-data stream exhibits a forward resolution; and said return-data stream exhibits a return resolution less than said forward resolution.

39. A method as claimed in claim 35 wherein:

said forward-data stream and said return-data stream exhibit forward-error and return-error levels, respectively, with said return-error level being greater than said forward-error level; and said first-estimation-and-convergence and said second-estimation-and-convergence algorithms each control a rate of convergence to achieve a predetermined effective return-error level that is less than said return-error level.

40. A method of managing distortion in a digital communications transmitter in which at least a portion of said distortion is introduced by analog-transmitter components, said method comprising:

providing a linear predistorter located upstream of said analog-transmitter components;

providing a nonlinear predistorter located upstream of said analog-transmitter components;

obtaining a forward-data stream configured to convey digital information, said forward-data stream being obtained upstream of said linear predistorter and upstream of said nonlinear predistorter;

generating a return-data stream from a feedback signal obtained from said analog-transmitter components;

training said linear predistorter in response to said forward-data stream and said return-data stream to compensate for linear distortion introduced by said analog-transmitter components; and training said nonlinear predistorter in response to said forward-data stream and said return-data stream to compensate for nonlinear distortion introduced by said analog-transmitter components.

41. A method of managing distortion in a digital communications transmitter in which at least a portion of said distortion is introduced by analog-transmitter components that include a power amplifier which produces a power-amplifier-output signal, said method comprising:

obtaining a forward-data stream provided by a peak-reduction section and configured to convey digital information;

training a linear predistorter which is responsive to said forward-data stream and is located upstream of said analog-transmitter components to compensate for linear distortion introduced by said analog-transmitter components;

training a nonlinear predistorter which is responsive to said forward-data stream and is located upstream of said analog-transmitter components to compensate for nonlinear distortion introduced by said analog-transmitter components;

obtaining an residual value that estimates uncompensated nonlinear distortion introduced by said analog-transmitter components into said power-amplifier-output signal; and operating said peak-reduction section so that an amount of peak reduction imposed in said forward-data stream is responsive to said residual value.

42. A method as claimed in claim 41 wherein said operating activity increases said amount of peak reduction when said residual value indicates nonlinear distortion exceeding a predetermined amount.

43. A method of managing distortion in a digital communications transmitter in which at least a portion of said distortion is introduced by analog-transmitter components, said method comprising:

obtaining a forward-data stream configured to convey digital information;

obtaining a return-data stream from said analog-transmitter components;
training a linear predistorter which is responsive to said forward-data stream and is located upstream of said analog-transmitter components by processing said return-data stream to compensate for linear distortion introduced by said analog-transmitter components; and
training a nonlinear predistorter which is responsive to said forward-data stream and is located upstream of said analog-transmitter components by processing said return-data stream to compensate for nonlinear distortion introduced by said analog-transmitter components;
wherein said forward-data stream exhibits a forward resolution and said return-data stream exhibits a return resolution less than said forward resolution.

44. A method of managing distortion in a digital communications transmitter in which at least a portion of said distortion is introduced by analog-transmitter components, said method comprising:
obtaining a forward-data stream configured to convey digital information;
obtaining a return-data stream from said analog-transmitter components;
training a linear predistorter which is responsive to said forward-data stream and is located upstream of said analog-transmitter components by implementing an estimation-and-convergence algorithm responsive to said forward-data stream and to said return-data stream to compensate for linear distortion introduced by said analog-transmitter components; and
training a nonlinear predistorter which is responsive to said forward-data stream and is located upstream of said analog-transmitter components by implementing an estimation-and-convergence algorithm responsive to said forward-data stream and to said return-data stream to compensate for nonlinear distortion introduced by said analog-transmitter components;
wherein said forward-data stream and said return-data stream exhibit forward-error and return-error levels, respectively, with said return-error level being greater than said forward-error level, and said estimation-and-convergence algorithms control a rate of convergence to achieve a predetermined effective return-error level that is less than said return-error level.

45. A method of managing distortion in a digital communications transmitter in which at least a portion of said distortion is introduced by analog-transmitter components, said method comprising:
obtaining a forward-data stream configured to convey digital information;
obtaining a return-data stream from said analog-transmitter components;
training a linear predistorter which is responsive to said forward-data stream and is located upstream of said analog-transmitter components by implementing an estimation-and-convergence algorithm responsive to said forward-data stream and to said return-data stream to compensate for linear distortion introduced by said analog-transmitter components; and
training a nonlinear predistorter which is responsive to said forward-data stream and is located upstream of said analog-transmitter components by implementing an estimation-and-convergence algorithm responsive to said forward-data stream and to said return-data stream to compensate for nonlinear distortion introduced by said analog-transmitter components;

wherein said estimation-and-convergence algorithms estimate filter coefficients which influence said forward-data and return-data streams, generate an error signal by combining said forward-data and return-data streams, and repetitively revise said filter coefficients to minimize said error signal and to decorrelate said error signal from said forward-data stream.

46. A method of managing distortion in a digital communications transmitter in which at least a portion of said distortion is introduced by analog-transmitter components, said method comprising:
obtaining a forward-data stream configured to convey digital information;
obtaining a return-data stream from said analog-transmitter components;
delaying said forward-data stream to form a delayed-forward-data stream in temporal alignment with said return-data stream;
forming an error signal by combining said delayed-forward-data stream and said return-data stream;
training a linear predistorter which is responsive to said forward-data stream and is located upstream of said analog-transmitter components to compensate for linear distortion introduced by said analog-transmitter components;
training a nonlinear predistorter which is responsive to said forward-data stream and is located upstream of said analog-transmitter components to compensate for nonlinear distortion introduced by said analog-transmitter components; and
performing said linear-predistorter-training and nonlinear-predistorter-training activities by implementing an estimation-and-convergence algorithm that converges upon filter coefficients which minimize said error signal.

47. A method as claimed in claim 46 wherein:
said forward-data and return-data streams are complex data streams; and
said delaying activity comprises delaying said forward-data stream to compensate for common mode delay between said forward-data and return-data streams.

48. A method as claimed in claim 46 wherein:
said forward-data stream propagates through said nonlinear predistorter and through said linear predistorter in response to a clock signal; and
said delaying activity delays at least a portion of said forward-data stream by an integral number of cycles of said clock signal and further delays said portion of said forward-data stream by a fraction of a cycle of said clock signal.

49. A method of managing distortion in a digital communications transmitter in which at least a portion of said distortion is introduced by analog-transmitter components, said method comprising:
obtaining a forward-data stream configured to convey digital information;
training a linear predistorter which is responsive to said forward-data stream and is located upstream of said analog-transmitter components to compensate for linear distortion introduced by said analog-transmitter components; and
training a nonlinear predistorter which is responsive to said forward-data stream and is located upstream of said analog-transmitter components to compensate for nonlinear distortion introduced by said analog-transmitter components, wherein said nonlinear-predistorter-training activity comprises:

generating a plurality of basis-function-data streams, wherein each basis-function-data stream is responsive to $X(n) \cdot |X(n)|^K$, where $X(n)$ represents said forward-data stream, and K is an integer greater than or equal to one;

estimating filter coefficients for filters that process said basis-function streams;

filtering said basis-function-data streams in said filters to generate a plurality of filtered-basis-function-data streams;

combining said filtered-basis-function-data streams and said forward-data stream; and repetitively revising said filter coefficients to compensate for said nonlinear distortion.

50. A method of managing distortion in a digital communications transmitter in which at least a portion of said distortion is introduced by analog-transmitter components that include a power amplifier which produces a power-amplifier-output signal, said method comprising:

obtaining a forward-data stream provided by a peak-reduction section and configured to convey digital information;

obtaining an RF-analog signal from said analog-transmitter components;

generating a return-data stream from said RF-analog signal;

implementing a first-estimation-and-convergence algorithm to train a linear predistorter to compensate for linear distortion introduced by said analog-transmitter components;

implementing a second-estimation-and-convergence algorithm to train a non-linear predistorter to compensate for nonlinear distortion introduced by said analog-transmitter components;

obtaining an residual value that estimates uncompensated nonlinear distortion introduced by said analog-transmitter components into said power-amplifier-output signal; and operating said peak-reduction section so that an amount of peak reduction imposed in said forward-data stream is responsive to said residual value.

* * * * *